United States Patent
Komori et al.

(10) Patent No.: US 11,852,973 B2
(45) Date of Patent: Dec. 26, 2023

(54) PHOTOSENSITIVE RESIN COMPOSITION, RESIN SHEET, CURED FILM, ORGANIC EL DISPLAY DEVICE, SEMICONDUCTOR ELECTRONIC COMPONENT, SEMICONDUCTOR DEVICE, AND METHOD FOR PRODUCING ORGANIC EL DISPLAY DEVICE

(71) Applicant: TORAY Industries, Inc., Tokyo (JP)

(72) Inventors: Yusuke Komori, Otsu (JP); Kazuto Miyoshi, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 351 days.

(21) Appl. No.: 17/273,401

(22) PCT Filed: Sep. 4, 2019

(86) PCT No.: PCT/JP2019/034699
§ 371 (c)(1),
(2) Date: Mar. 4, 2021

(87) PCT Pub. No.: WO2020/059485
PCT Pub. Date: Mar. 26, 2020

(65) Prior Publication Data
US 2021/0332166 A1    Oct. 28, 2021

(30) Foreign Application Priority Data
Sep. 18, 2018   (JP) .................. 2018-173426

(51) Int. Cl.
| | |
|---|---|
| *G03F 7/023* | (2006.01) |
| *G03F 7/022* | (2006.01) |
| *G03F 7/40* | (2006.01) |
| *C08F 2/48* | (2006.01) |
| *C08F 4/26* | (2006.01) |
| *C08F 12/24* | (2006.01) |
| *G03F 7/038* | (2006.01) |
| *G03F 7/20* | (2006.01) |
| *G03F 7/32* | (2006.01) |
| *G03F 7/38* | (2006.01) |
| *H10K 85/30* | (2023.01) |
| *H10K 85/60* | (2023.01) |
| *H10K 50/11* | (2023.01) |

(52) U.S. Cl.
CPC .............. *G03F 7/0236* (2013.01); *C08F 2/48* (2013.01); *C08F 4/26* (2013.01); *C08F 12/24* (2013.01); *G03F 7/0226* (2013.01); *G03F 7/0233* (2013.01); *G03F 7/0382* (2013.01); *G03F 7/2004* (2013.01); *G03F 7/327* (2013.01); *G03F 7/38* (2013.01); *G03F 7/40* (2013.01); *H10K 85/342* (2023.02); *H10K 85/626* (2023.02); *H10K 85/631* (2023.02); *H10K 85/654* (2023.02); *H10K 50/11* (2023.02)

(58) Field of Classification Search
CPC .... G03F 7/0236; G03F 7/0233; G03F 7/0226; G03F 7/40; C08G 8/014
See application file for complete search history.

(56) References Cited

U.S. PATENT DOCUMENTS

| | | | |
|---|---|---|---|
| 2002/0119392 A1 | 8/2002 | Oda et al. | |
| 2004/0146800 A1* | 7/2004 | Watanabe | B41C 1/1016 430/160 |
| 2015/0301453 A1 | 10/2015 | Komori et al. | |
| 2015/0376157 A1* | 12/2015 | Echigo | C07C 69/734 558/268 |
| 2016/0342088 A1 | 11/2016 | Hatakeyama et al. | |

FOREIGN PATENT DOCUMENTS

| | | |
|---|---|---|
| JP | 10-48817 A | 2/1998 |
| JP | 2001-163945 A | 6/2001 |
| JP | 2002-55446 A | 2/2002 |
| JP | 2004-219813 A | 8/2004 |
| JP | 2017-102420 A | 6/2017 |
| WO | WO 2014/097992 A1 | 6/2014 |

OTHER PUBLICATIONS

International Search Report, issued in PCT/JP2019/034699, dated Nov. 19, 2019.
Written Opinion of the International Searching Authority, issued in PCT/JP2019/034699, dated Nov. 19, 2019.

* cited by examiner

*Primary Examiner* — John S Chu
(74) *Attorney, Agent, or Firm* — Birch, Stewart, Kolasch & Birch, LLP

(57) ABSTRACT

The present invention relates to a photosensitive resin composition having high sensitivity, high bending resistance for the cured film, and high long-term reliability for an organic EL display device in which the cured film is used. The present invention is a photosensitive resin composition containing an alkali-soluble resin (a), a phenolic resin (b) having a halogen atom, and a photosensitive compound (c).

18 Claims, 4 Drawing Sheets

PHOTOSENSITIVE RESIN COMPOSITION, RESIN SHEET, CURED FILM, ORGANIC EL DISPLAY DEVICE, SEMICONDUCTOR ELECTRONIC COMPONENT, SEMICONDUCTOR DEVICE, AND METHOD FOR PRODUCING ORGANIC EL DISPLAY DEVICE

TECHNICAL FIELD

The present invention relates to a photosensitive resin composition containing an alkali-soluble resin, a phenolic resin having a halogen atom, and a photosensitive compound.

BACKGROUND ART

Among display devices having a thin display, such as smartphones, tablet PCs, and televisions, many products using an organic electroluminescence (hereinafter, "organic EL") display device have been developed.

In general, an organic EL display device has a driving circuit, a planarization layer, a first electrode, an insulation layer, a light-emitting layer, and a second electrode on a substrate, and is enabled to emit light by applying a voltage across the first electrode and the second electrode that are opposed to each other. Among these, examples of materials generally used as materials for the planarization layer and as materials for the insulation layer include a photosensitive resin composition that can be patterned by ultraviolet irradiation. Above all, a photosensitive resin composition using a polyimide-based or polybenzoxazole-based resin is suitably used because the high heat resistance of the resin and the smaller amount of gas component generated from the cured film make it possible to afford a highly reliable organic EL display device (see, for example, Patent Literature 1).

On the other hand, the photosensitive resin composition is required to have higher sensitivity in order to shorten the exposure time for reasons such as an increase in the size of the substrate and an improvement in productivity.

As a photosensitive resin composition capable of having high sensitivity, a mixture of a novolac resin or a polyhydroxystyrene resin and a polyimide resin or a polybenzoxazole resin has been studied (see, for example, Patent Literature 2). However, ordinary novolac resins and polyhydroxystyrene resins have a problem in that such resins have low heat resistance and mechanical characteristics.

In recent years, flexible organic EL display devices formed on a resin film substrate have been actively developed. A flexible organic EL display device structurally has a bendable portion and/or a bent and fixed portion, and this bent portion involves a bending stress being applied to the planarization layer and the insulation layer. In a flexible organic EL display device including such a bent portion, the material for the planarization layer and the material for the insulation layer are required to have high bending resistance. For these reasons, a photosensitive resin composition that can be patterned with high sensitivity and afford a cured film having high bending resistance has been strongly desired to be developed.

To solve these problems, for example, a method in which a resin composition is caused to contain a bisphenol A-based novolac resin, a polyamide resin, and an o-quinone diazide compound has been proposed (see, for example, Patent Literature 3).

CITATION LIST

Patent Literature

Patent Literature 1: JP2002-091343A
Patent Literature 2: JP2008-268788A
Patent Literature 3: JP2015-187668A

SUMMARY OF INVENTION

Technical Problem

However, although the photosensitive resin composition obtained using the method described in Patent Literature 3 has higher sensitivity and enables the cured film to have higher mechanical properties, a problem has been found out in that the long-term reliability of an organic EL display device for which the cured film is used is insufficient. The demand for higher reliability for organic EL display devices is becoming more stringent year after year, and materials required as materials for the planarization layer and materials for the insulation layer are ones that can maintain high film properties even after reliability tests carried out under acceleration conditions such as high temperature, high humidity, and light irradiation. In view of this, an object of the present invention is to provide a photosensitive resin composition that has high sensitivity, affords high bending resistance to the cured film, and affords high long-term reliability to an organic EL display device for which the cured film is used.

Solution to Problem

The present invention is a photosensitive resin composition containing an alkali-soluble resin (a), a phenolic resin (b) having a halogen atom, and a photosensitive compound (c).

Advantageous Effects of Invention

A photosensitive resin composition according to the present invention makes it possible to obtain a photosensitive resin composition that has high sensitivity, affords high bending resistance to the cured film, and affords high long-term reliability to an organic EL display device for which the cured film is used.

DESCRIPTION OF EMBODIMENTS

Figure 1:
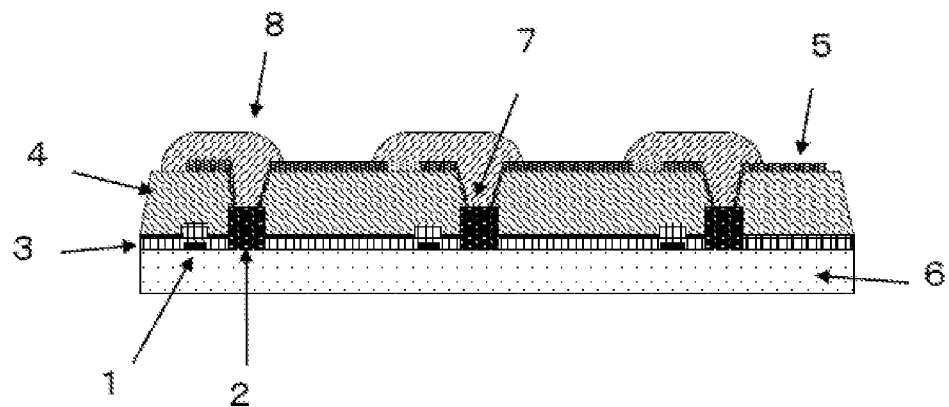
FIG. 1 is a cross-sectional view of an example of a TFT substrate.

Embodiments of the present invention will be described in detail.

A photosensitive resin composition according to the present invention contains an alkali-soluble resin (a), a phenolic resin (b) having a halogen atom, and a photosensitive compound (c).

<Alkali-Soluble Resin (a)>

The photosensitive resin composition according to the present invention contains an alkali-soluble resin (a). In the present invention, the term "alkali-soluble" means that a dissolution rate is 50 nm/minute or more, wherein the dissolution rate is determined as follows: a solution of a resin dissolved in γ-butyrolactone is applied to a silicon wafer, and prebaked at 120° C. for four minutes to form a prebaked film having a film thickness of 10 μm±0.5 μm; then, the prebaked film is immersed in an aqueous solution of 2.38 wt % tetramethylammonium hydroxide at 23±1° C. for one minute, and then rinsed with pure water; and the dissolution rate is determined from the resulting decrease in the thickness of the film.

The alkali-soluble resin (a) in the present invention has a hydroxyl group and/or an acidic group in a structural unit of the resin and/or at an end of the main chain of the resin in order to have alkali solubility. Examples of acidic groups include a carboxy group, phenolic hydroxyl group, sulfonic group, and the like. In addition, the alkali-soluble resin (a) preferably has a fluorine atom in order to have water repellency.

Examples of alkali-soluble resins (a) in the present invention include, but are not limited to, polyimides, polyimide precursors, polybenzoxazole precursors, polyamide-imides, polyamide-imide precursors, polyamides, polymers of radical polymerizable monomers having an acidic group, phenolic resins, and the like. The photosensitive resin composition may contain two or more of these resins. Among these alkali-soluble resins (a), one or more selected from the group consisting of polyimides, polybenzoxazoles, polyamide-imides, precursors thereof, and copolymers thereof are preferable; polyimides, polybenzoxazoles, polyamide-imides, precursors thereof, or copolymers thereof are more preferable; and polyimides, polyimide precursors, polybenzoxazole precursors, or copolymers thereof are particularly preferable; because they have high development adhesion and excellent heat resistance and generate a smaller amount of outgassing under high temperature, hence affording high long-term reliability to an organic EL display device in which the below-mentioned cured film is used. Furthermore, polyimide precursors or polybenzoxazole precursors are still more preferable from the viewpoint of further enhancing the sensitivity. Here, a polyimide precursor refers to a resin that is converted to a polyimide through heating treatment or chemical treatment, and examples of such polyimide precursors include polyamic acids, polyamic acid esters, and the like. A polybenzoxazole precursor refers to a resin that is converted to a polybenzoxazole through heating treatment or chemical treatment, and examples of such polybenzoxazole precursors include polyhydroxyamides and the like.

The above-mentioned polyimide precursor and polybenzoxazole precursor have a structural unit represented by the below-mentioned general formula (3), and the polyimide has a structural unit represented by the below-mentioned general formula (4). The photosensitive resin composition may contain two or more of these, or may contain a resin obtained by copolymerizing a structural unit represented by the general formula (3) and a structural unit represented by the general formula (4).

[Chem. 1]

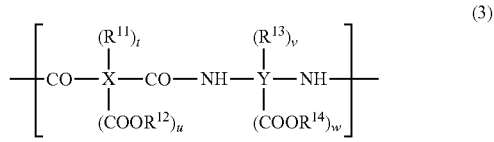

(3)

In the general formula (3), X represents a divalent to octavalent organic group, and Y represents a divalent to undecavalent organic group. $R^{11}$ and $R^{13}$ represent a hydroxyl group or a sulfonic group, and may each be a single group or a mixture of different kinds thereof. $R^{12}$ and $R^{14}$ represent a hydrogen atom or a $C_{1-20}$ monovalent hydrocarbon group. t, u, and w represent an integer of 0 to 3, and v represents an integer of 0 to 6. However, t+u+v+w>0.

[Chem. 2]

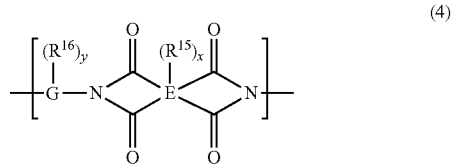

(4)

In the general formula (4), E represents a tetravalent to decavalent organic group, and G represents a divalent to octavalent organic group. $R^{15}$ and $R^{16}$ represent a carboxy group, sulfonic group, or hydroxyl group. A plurality of $R^{15}$s and $R^{16}$s may be the same or different. x and y independently represent an integer of 0 to 6. However, x+y>0.

The polyimide, polyimide precursor, polybenzoxazole precursor, or copolymer thereof preferably has 5 to 100000 structural units represented by the general formula (3) or (4). In addition, such a material may have another structural unit in addition to a structural unit represented by the general formula (3) or (4). In this case, the material preferably has the structural units represented by the general formula (3) or (4) in an amount of 50 mol % or more with respect to all the structural units.

In the general formula (3), $X(R^{11})_t(COOR^{12})_u$ represents a residue of an acid. X is a divalent to octavalent organic group, and among others, preferably a $C_{5-40}$ organic group having an aromatic ring or a cyclic aliphatic group.

Examples of acids include: dicarboxylic acids such as terephthalic acid, isophthalic acid, diphenyletherdicarboxylic acid, bis(carboxyphenyl)hexafluoropropane, biphenyldicarboxylic acid, benzophenonedicarboxylic acid, and triphenyldicarboxylic acid; tricarboxylic acids such as trimellitic acid, trimesic acid, diphenylethertricarboxylic acid, and biphenyltricarboxylic acid; tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'-benzophenonetetracarboxylic acid, 2,2-bis(3,4-dicarboxyphenyl) hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3- dicarboxyphenyl)methane, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, 3,4,9,10-perylenetetracarboxylic acid, aromatic tetracarboxylic acids having the below-mentioned structure, aliphatic tetracarboxylic acids such as butanetetracarboxylic acid, and aliphatic tetracarboxylic acids containing a cyclic aliphatic group, such as 1,2,3,4-cyclopentane tetracarboxylic acid; and the like. Two or more of these may be used.

Specific examples of dianhydrides include pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 2,2-bis(3,4-dicarboxyphenyl)propane dianhydride, 2,2-bis(2,3-dicarboxyphenyl)propane dianhydride, 1,1-bis(3,4-dicarboxyphenyl)ethane dianhydride, 1,1-bis(2,3-dicarboxyphenyl)ethane dianhydride, bis

[Chem. 3]

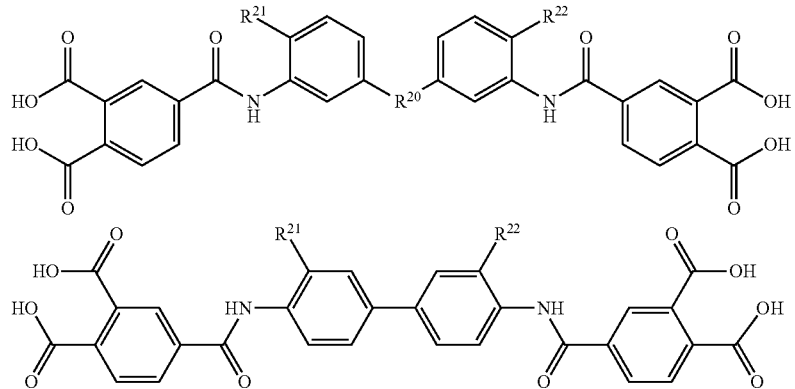

$R^{20}$ represents an oxygen atom, $C(CF_3)_2$, or $C(CH_3)_2$. $R^{21}$ and $R^{22}$ independently represent a hydrogen atom or a hydroxyl group.

In tricarboxylic acids and tetracarboxylic acids among the above-mentioned acids, one or two carboxy groups correspond to $(COOR^{12})$ in the general formula (3).

These acids may be used as they are, or may be used in the form of an anhydride, active ester, or active amide. Examples of active esters include N-hydroxysuccinimide ester compounds obtained by allowing a carboxyl group of an acid to react with N-hydroxysuccinimide, and examples of active amides include: N-acylimimidazole compounds obtained by allowing a carboxyl group of an acid to react with N,N'-carbonyldiimimidazole; and the like.

In the general formula (4), $E(R^{15})_x$ represents a residue of an acid dianhydride. E is a tetravalent to decavalent organic group, and among others, preferably a $C_{5-40}$ organic group having an aromatic ring or a cyclic aliphatic group.

(3,4-dicarboxyphenyl)methane dianhydride, bis(2,3-dicarboxyphenyl)methane dianhydride, bis(3,4-dicarboxyphenyl)ether dianhydride, 1,2,5,6-naphthalenetetracarboxylic dianhydride, 9,9-bis(3,4-dicarboxyphenyl)fluorene dianhydride, 9,9-bis{4-(3,4-dicarboxyphenoxy)phenyl}fluorene dianhydride, 2,3,6,7-naphthalenetetracarboxylic dianhydride, 2,3,5,6-pyridinetetracarboxylic acid dianhydride, 3,4,9,10-perylenetetracarboxylic dianhydride, 2,2-bis(3,4-dicarboxyphenyl)hexafluoropropane dianhydride, aromatic tetracarboxylic dianhydrides such as dianhydrides having the below-mentioned structure, aliphatic tetracarboxylic dianhydrides such as butanetetracarboxylic dianhydride, aliphatic tetracarboxylic dianhydride containing a cyclic aliphatic group, such as 1,2,3,4-cyclopentane tetracarboxylic dianhydride, and the like. Two or more of these may be used.

[Chem. 4]

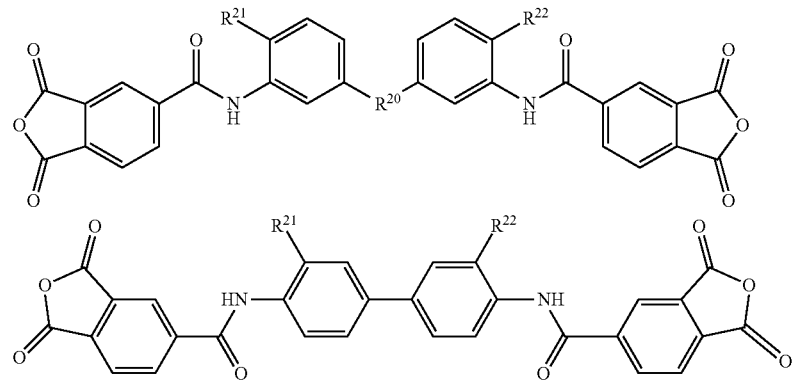

$R^{20}$ represents an oxygen atom, $C(CF_3)_2$, or $C(CH_3)_2$. $R^{21}$ and $R^{22}$ independently represent a hydrogen atom or a hydroxyl group.

$Y(R_{13})_v(COOR_{14})_w$ in the above-mentioned general formula (3) and $G(R^{16})_y$ in the above-mentioned general formula (4) represent a residue of a diamine. Y is a divalent to undecavalent organic group, G is a divalent to octavalent organic group, and among others, these are each preferably a $C_{5-40}$ organic group having an aromatic ring or a cyclic aliphatic group.

Specific examples of diamines include 3,4'-diaminodiphenyl ether, 4,4'-diaminodiphenyl ether, 3,4'-diaminodiphenyl methane, 4,4'-diaminodiphenyl methane, 1,4-bis(4-aminophenoxy)benzene, benzidine, m-phenylene diamine, p-phenylene diamine, 1,5-naphthalene diamine, 2,6-naphthalene diamine, bis(4-aminophenoxy)biphenyl, bis{4-(4-aminophenoxy)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, 2,2'-di(trifluoromethyl)-4,4'-diaminobiphenyl, 9,9-bis(4-aminophenyl)fluorene, 2,2'-bis(trifluoromethyl)-5,5'-dihydroxybenzidine, 3,5-diaminobenzoic acid, 3,4-diaminobenzoic acid, 2,5-diaminobenzoic acid, aromatic diamines such as the same compounds as these with the proviso that at least a part of the hydrogen atoms on the aromatic ring is substituted with an alkyl group or a halogen atom, aliphatic diamines containing a cyclic aliphatic group, such as cyclohexyl diamine and methylenebiscyclohexylamine, diamines having the below-mentioned structure, and the like. Two or more of these may be used.

[Chem. 5]

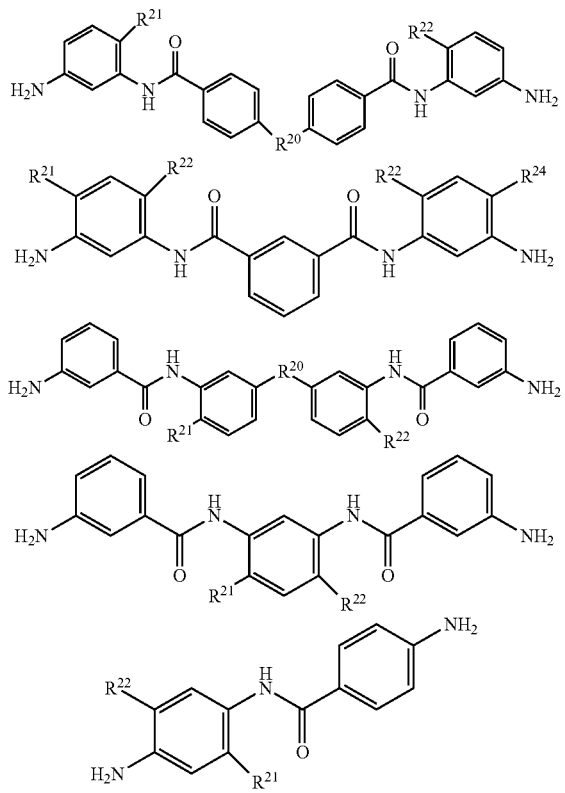

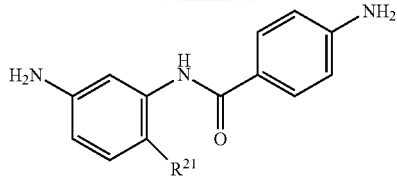

$R^{20}$ represents an oxygen atom, $C(CF_3)_2$, or $C(CH_3)_2$. $R^{21}$ to $R^{24}$ independently represent a hydrogen atom or a hydroxyl group.

These diamines may be used as they are, or may be used, for example, as a diisocyanate compound obtained by allowing an amino group of a diamine to react with phosgene, or, for example, as a trimethylsilylated diamine obtained by allowing an amino group of a diamine to react with chlorotrimethylsilane.

In addition, capping an end of such a resin with: a monoamine having an acidic group; an anhydride; an acid chloride; a monocarboxylic acid; or an active ester compound can afford a resin having an acidic group at an end of the main chain.

Preferable examples of monoamines having an acidic group include 2-aminobenzoic acid, 3-aminobenzoic acid, 4-aminobenzoic acid, 4-aminosalicyl acid, 5-aminosalicyl acid, 6-aminosalicyl acid, 3-amino-4,6-dihydroxypyrimidine, 2-aminophenol, 3-aminophenol, 4-aminophenol, 2-aminothiophenol, 3-aminothiophenol, 4-aminothiophenol, and the like. Two or more of these may be used.

Preferable examples of anhydrides include phthalic anhydrides, maleic anhydrides, nadic anhydrides, cyclohexanedicarboxylic anhydrides, 3-hydroxyphthalic anhydride, and the like. Two or more of these may be used.

Preferable examples of monocarboxylic acids include 3-carboxyphenol, 4-carboxyphenol, 3-carboxythiophenol, 4-carboxythiophenol, and the like. Two or more of these may be used.

Preferable examples of acid chlorides include: monoacid chloride compounds obtained by forming an acid chloride with a carboxy group in the above-mentioned monocarboxylic acid; monoacid chloride compounds obtained by forming an acid chloride with only one carboxy group in a dicarboxylic acid such as terephthalic acid, phthalic acid, maleic acid, cyclohexanedicarboxylic acid, 1,5-dicarboxynaphthalene, 1,6-dicarboxynaphthalene, 1,7-dicarboxynaphthalene, or 2,6-dicarboxy naphthalene; and the like. Two or more of these may be used.

Preferable examples of active ester compounds include: reactants between the above-mentioned monoacid chloride compound and N-hydroxybenzotriazole or N-hydroxy-5-norbornene-2,3-dicarboxyimide; and the like. Two or more of these may be used.

The alkali-soluble resin (a) in the present invention is synthesized using a known method.

Examples of methods of producing a polyamic acid which is a polyimide precursor include a method in which a tetracarboxylic dianhydride and a diamine compound are allowed to react in a solvent at a low temperature.

Examples of methods of producing a polyamic acid ester which is equally a polyimide precursor include; not only a method in which the above-mentioned polyamic acid is allowed to react with an esterifying agent; but also a method in which a diester is obtained from a tetracarboxylic dianhydride and alcohol followed by allowing the diester to react with an amine in the presence of a condensing agent in a solvent; a method in which a diester is obtained from a tetracarboxylic dianhydride and alcohol followed by forming the remaining dicarboxylic acid into an acid chloride, which is allowed to react with an amine in a solvent; and the like. From the viewpoint of easiness of synthesis, it is preferable to include a step of allowing a polyamic acid and an esterifying agent to react. Such an esterifying agent can be used using a known method, without particular limitation, and is preferably N,N-dimethylformamidedialkylacetal from the viewpoint of easiness of purification of the resulting resin.

Examples of methods of producing a polyhydroxyamide which is a polybenzoxazole precursor include a method in which a bisaminophenol compound and a dicarboxylic acid are subjected to condensation reaction in a solvent. Specific examples include; a method in which a dehydration condensing agent such as dicyclohexylcarbodiimide (DCC) is allowed to react with an acid, and to the resulting product, a bisaminophenol compound is added; a method in which a solution of dicarboxylic dichloride is dropwise added to a solution of a bisaminophenol compound having a tertiary amine such as pyridine added thereto; and the like.

Examples of methods of producing a polyimide include: a method in which a polyamic acid or polyamic acid ester obtained by the above-mentioned method is cyclodehydrated in a solvent: and the like. Examples of methods of cyclodehydration include: chemical treatment with an acid, a base, or the like: heating treatment; and the like.

Examples of methods of producing a polybenzoxazole include: a method in which a polyhydroxyamide obtained using the above-mentioned method is cyclodehydrated in a solvent: and the like. Examples of methods of cyclodehydration include: chemical treatment with an acid, a base, or the like: heating treatment; and the like.

Examples of polyamide-imide precursors include: tricarboxylic acids; the corresponding tricarboxylic anhydrides; polymers between a tricarboxylic anhydride halide and a diamine compound. Polymers between a trimellitic anhydride chloride and an aromatic diamine compound are preferable. Examples of methods of producing a polyamide-imide precursor include; a method in which a tricarboxylic acid, the corresponding tricarboxylic anhydride, a tricarboxylic anhydride halide, or the like and a diamine compound are allowed to react in a solvent at a low temperature; and the like.

Examples of methods of producing a polyamide-imide include: a method in which a trimellitic anhydride and an aromatic diisocyanate are allowed to react in a solvent; a method in which a polyamide-imide precursor obtained using the above-mentioned method is cyclodehydrated in a solvent: and the like. Examples of methods of cyclodehydration include: chemical treatment with an acid, a base, or the like: heating treatment; and the like.

Examples of polymerization solvents include, but are not limited particularly to: alkylene glycol monoalkyl ethers such as ethylene glycol monomethyl ether and propylene glycol monomethyl ether; alkyl acetates such as propyl acetate, butyl acetate, and isobutyl acetate; ketones such as methylisobutyl ketone and methyl propyl ketone; alcohols such as butyl alcohol and isobutyl alcohol; ethyl lactate, butyl lactate, dipropylene glycol dimethyl ether, diethylene glycol dimethyl ether, diethylene glycol ethylmethyl ether, diethylene glycol diethyl ether, 3-methoxybutyl acetate, ethylene glycol monoethyl ether acetate, gammabutylolactone, N-methyl-2-pyrrolidone, diacetone alcohol, N-cyclohexyl-2-pyrrolidone, N,N-dimethylformamide, N,N-dimethylacetamide, dimethyl sulfoxide, propylene glycol monomethyl ether acetate, N,N-dimethylisobutyric amide, 3-methoxy-N,N-dimethylpropionamide, 3-butoxy-N,N-dimethylpropionamide, 1,3-dimethyl-2-imidazolidinone, N,N-dimethylpropylene urea, deltavalerolactone, 2-phenoxyethanol, 2-pyrrolidone, 2-methyl-1,3-propanediol, diethylene glycol butyl ether, triacetin, butyl benzoate, cyclohexyl benzene, bicyclohexyl, o-nitroanisole, diethylene glycol monobutyl ether, triethylene glycol monomethyl ether, N-(2-hydroxyethyl)-2-pyrrolidone, N,N-dimethyl propaneamide, N,N-dimethyl isobutylamide, N,N,N',N'-tetramethyl urea, 3-methyl-2-oxazolidinone; and the like.

<Phenolic Resin (b) Having Halogen Atom>

A photosensitive resin composition according to the present invention contains a phenolic resin (b) having a halogen atom (hereinafter simply referred to as "a phenolic resin (b)" in some cases). Containing a phenolic resin (b) makes it possible to enhance the long-term reliability of an organic EL display device in which the below-mentioned cured film according to the present invention is used as a planarization layer and/or insulation layer.

Specific examples of substitution forms of a halogen atom include halogen atoms, halo(cyclo)alkyl groups, haloaryl groups, and combinations thereof. In this regard, a halo (cyclo)alkyl group refers to an alkyl group or cycloalkyl group at least a part of which is halogenated, and a haloaryl group refers to an aryl group at least a part of which is halogenated. Examples of haloalkyl groups include trihalomethyl groups, pentahaloethyl groups, and the like. Examples of haloaryl groups include dihalophenyl groups, pentahalophenyl groups, and the like. In cases where a substituent having a halogen atom is a divalent or more multivalent group, the remaining bonding hands form a bond with an arbitrary atom or substituent, and may be linked with the main chain of the phenolic resin (b) via another substituent. In the phenolic resin (b) having a halogen atom, the halogen atom preferably contains a fluorine atom. Having a fluorine atom makes it possible to impart water repellency to the surface of the film during alkaline development and to inhibit penetration through the surface. For this reason, the resulting photosensitive resin composition of a positive-working type causes inhibited film loss during development and affords a photosensitive resin film having a high residual film rate after development.

The phenolic resin is, for example, a novolac resin or a resole resin, and is obtained using: a method in which any of various phenols is singly polycondensed, or a mixture of the phenols is polycondensed with an aldehyde such as formalin; or a method in which a methylol compound of a phenol is polycondensed with a phenol. A phenolic resin having a halogen atom according to the present invention is obtained using a phenol having a halogen atom.

Specific examples of phenols having a halogen atom include 2-fluorophenol, 3-fluorophenol, 4-fluorophenol, 2,4-difluorophenol, 2,6-difluorophenol, 3,4-difluorophenol, 3,5-difluorophenol, 2,4,6-trifluorophenol, 3,4,5-trifluorophenol, 2,3,5,6-tetrafluorophenol, pentafluorophenol, 2,3,5,6-tetrafluoro-4-trifluoromethylphenol, 2,3,5,6-tetrafluoro-4-pentafluorophenylphenol, perfluoro-1-naphthol, perfluoro-2-naphthol, 2-chlorophenol, 3-chlorophenol, 4-chlorophenol, 2,4-dichlorophenol, 2,6-dichlorophenol, 3,4-dichlorophenol, 3,5-dichlorophenol, 2,4,6-trichlorophenol, 3,4,5-trichlorophenol, 2,3,5,6-tetrachlorophenol, pentachlorophenol, 2,3,5,6-tetrachloro-4-trichloromethylphenol, 2,3,5,6-tetrachloro-4-pentachlorophenylphenol, perchloro-1-naphthol, perchloro-2-naphthol, 2-bromophenol, 3-bromophenol, 4-bromophenol, 2,4-dibromophenol, 2,6-dibromophenol, 3,4-dibromophenol, 3,5-dibromophenol, 2,4,6-tribromophenol, 3,4,5-tribromophenol, 2,3,5,6-tetrabromophenol, pentabromophenol, 2,3,5,6-tetrabromo-4-tribromomethylphenol, 2,3,5,6-tetrabromo-4-pentabromophenylphenol, perbromo-1-naphthol, perbromo-2-naphthol, 2-iodophenol, 3-iodophenol, 4-iodophenol, 2,4-diiodophenol, 2,6-diiodophenol, 3,4-diiodophenol, 3,5-diiodophenol, 2,4,6-triiodophenol, 3,4,5-triiodophenol, 2,3,5,6-tetraiodophenol, pentaiodophenol, 2,3,5,6-tetraiodo-4-triiodomethylphenol, 2,3,5,6-tetraiodo-4-pentaiodophenylphenol, periodo-1-naphthol, periodo-2-naphthol, 2-(trifluoromethyl)phenol, 3-(trifluoromethyl)phenol, 4-(trifluoromethyl)phenol, 2,6-bis(trifluoromethyl)phenol, 3,5-bis(trifluoromethyl)phenol, 2,4,6-tris(trifluoromethyl)phenol, bisphenol AF, and the like. These can be used singly or in mixture thereof.

In addition, examples of aldehydes used for polycondensation with a novolac resin or a resole resin include not only formalin but also paraformaldehyde, acetoaldehyde, benzaldehyde, hydroxybenzaldehyde, chloroacetoaldehyde, and the like. These can be used singly or in mixture thereof.

The methylol compound of a phenol is any one of the above-mentioned phenols which is methylolated with formaldehyde or the like, and has at least one or more methylol groups in the molecule.

In addition, a phenolic resin (b) used in the present invention may contain not only a phenol having a halogen atom but also a structure derived from another phenol to the extent that the above-mentioned characteristics are not degraded. In cases where the phenolic resin (b) contains a structure derived from another phenol, the phenolic resin (b) preferably has, as a repeating unit, a structural unit derived from a phenol having a halogen atom, wherein the amount of the structural unit is 50 to 100 mol % with respect to 100 mol % of all repeating units of the phenolic resin (b). Such a range makes it possible to enhance the long-term reliability of an organic EL display device in which the below-mentioned cured film according to the present invention is used as a planarization layer and/or insulation layer.

Specific examples of other phenols include phenols, p-cresol, m-cresol, o-cresol, 2,3-dimethylphenol, 2,4-dimethylphenol, 2,5-dimethylphenol, 2,6-dimethylphenol, 3,4-dimethylphenol, 3,5-dimethylphenol, 2,3,4-trimethylphenol, 2,3,5-trimethylphenol, 3,4,5-trimethylphenol, 2,4,5-trimethylphenol, methylene bisphenol, methylene bis p-cresol, resorcin, catechol, 2-methylresorcin, 4-methylresorcin, o-chlorophenol, m-chlorophenol, p-chlorophenol, 2,3-dichlorophenol, m-methoxyphenol, p-methoxyphenol, p-butoxyphenol, o-ethylphenol, m-ethylphenol, p-ethylphenol, 2,3-diethylphenol, 2,5-diethylphenol, p-isopropylphenol, α-naphthol, β-naphthol, bisphenol A, bisphenol F, bisphenol Z, bisphenol E, bisphenol C, bisphenol G, bisphenol M, bisphenol P, bisphenol PH, bisphenol TMC, bisphenol S, 2,2'-dihydroxybenzophenone, 4,4'-dihydroxybenzophenone, 2,4-dihydroxybenzophenone, 3,4-dihydroxybenzophenone, 2,3,4-trihydroxybenzophenone, 2,4,4'-trihydroxybenzophenone, 2,3,4,4'-tetrahydroxybenzophenone, 2,2',4,4'-tetrahydroxybenzophenone, and the like. These can be used singly or in mixture thereof.

The phenolic resin (b) preferably has a structural unit(s) represented by the general formula (1) and/or the general formula (2) from the viewpoint of making it possible to further enhance the long-term reliability of an organic EL display device in which the below-mentioned cured film according to the present invention is used as a planarization layer and/or insulation layer. The general formula (1) and/or the general formula (2) represent(s) a structural unit of a phenolic resin derived from a bisphenol.

[Chem. 6]

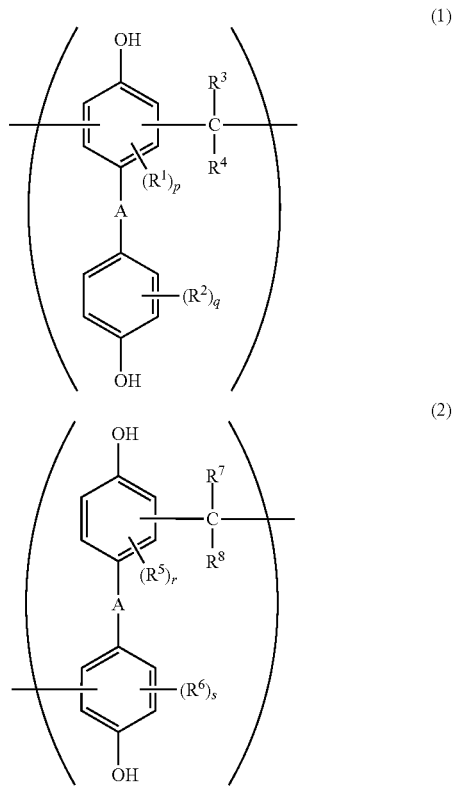

In the general formulae (1) and (2), A represents a divalent substituent having a halogen atom. $R^1$, $R^2$, $R^5$, and $R^6$ independently represent a hydrogen atom or an optionally substituted $C_{1-10}$ hydrocarbon group, methylol group, or alkoxymethyl group. $R^3$, $R^4$, $R^7$, and $R^8$ independently represent a hydrogen atom or an optionally substituted $C_{1-10}$ hydrocarbon group. p represents an integer of 0 to 2, q represents an integer of 0 to 4, and r and s represent an integer of 0 to 3.

Examples of A include divalent substituents such as $-CF_2-$, $-CCl_2-$, $-CBr_2-$, $-CI_2-$, $-C(CF_3)_2-$, $-C(CCl_3)_2-$, $-C(CBr_3)_2-$, and $-C(CI_3)_2-$. A that contains a fluorine atom is preferable, and $-C(CF_3)_2-$ is more preferable, from the viewpoint of being industrially available and containing fluorine the water repellency of which enhances the residual film rate obtained after development.

Examples of phenolic resins having a structural unit(s) represented by the general formula (1) and/or the general formula (2) include novolac resins and resole resins, which are obtained through polycondensing any single one of various bisphenols, or polycondensing a mixture of the phenols with an aldehyde such as formalin. Resins having a structural unit(s) represented by the general formula (1) and/or the general formula (2) are obtained using a bisphenol having a halogen atom.

Specific examples of bisphenols having a halogen atom include bisphenols AF, 2,2-bis(4-hydroxyphenyl)hexachloropropane, 2,2-bis(4-hydroxyphenyl)hexabromopropane, and 2,2-bis(4-hydroxyphenyl)hexaiodopropane. These can be used singly or in mixture thereof.

In addition, examples of aldehydes used for polycondensation with a novolac resin or a resole resin include not only formalin but also paraformaldehyde, acetoaldehyde, benzaldehyde, hydroxybenzaldehyde, chloroacetoaldehyde, and the like. These can be used singly or in mixture thereof.

A phenolic resin (b) used in the present invention may have a structure other than a structural unit(s) represented by the general formula (1) and/or the general formula (2), and it is preferable that the structural unit(s) represented by the general formula (1) and/or the general formula (2) are/is contained as a repeating unit(s) in an amount of 50 mol % or more with respect to 100 mol % of all repeating units constituting the phenolic resin (b) having a halogen atom. Such a range makes it possible to further enhance the long-term reliability of an organic EL display device in which the below-mentioned cured film according to the present invention is used as a planarization layer and/or insulation layer. It is more preferably 80 mol % or more, particularly preferably 100 mol %.

A phenolic resin (b) refers to such a resin having a weight-average molecular weight (Mw) of 500 or more in terms of polystyrene. Mw is preferably 50000 or less, more preferably 10000 or less. Having a weight-average molecular weight of 500 or more in terms of polystyrene enables the solubility in an alkaline developer to be easily adjusted within a desired range. On the other hand, having a weight-average molecular weight of 50000 or less in terms of polystyrene makes it possible to enhance the coatability and developability of the photosensitive resin composition.

In the present invention, the amount of the phenolic resin (b) is preferably 10 parts by mass or more, more preferably 20 parts by mass or more, with respect to 100 parts by mass of the alkali-soluble resin (a), from the viewpoint of enhancing the long-term reliability. On the other hand, it is preferably 100 parts by mass or less, more preferably 50 parts by mass or less, from the viewpoint of enhancing the bending resistance.

<Photosensitive Compound (c)>

The photosensitive resin composition according to the present invention contains a photosensitive compound (c). Examples of photosensitive compounds (c) include a photo acid generator (c1), a photo initiator (c2), and the like. A photo acid generator (c1) is a compound that generates acid when irradiated with light, and a photo initiator (c2) refers to a compound that, when exposed, undergoes bond cleavage and/or reaction to generate radicals.

The amount of the photosensitive compound (c) is preferably 25 to 100 parts by mass with respect to 100 parts by mass of the total of the alkali-soluble resin (a) and the resin (b).

Containing a photo acid generator (c1) allows acid to be generated in light-irradiated portions so that the light-irradiated portions can increase in solubility in an aqueous alkali solution, resulting in a positive-working type relief pattern in which the light-irradiated portions are dissolved. In addition, containing a photo acid generator (c1) and an epoxy compound or the below-mentioned thermal crosslinking agent allows the acid generated in the light-irradiated portions to promote the crosslinking reaction of the epoxy compound or thermal crosslinking agent, resulting in affording a negative-working type relief pattern in which the light-irradiated portions are insolubilized. On the other hand, containing a photo initiator and the below-mentioned radical polymerizable compound allows radical polymerization to progress in light-irradiated portions, resulting in affording a negative-working type relief pattern in which the light-irradiated portions are insolubilized.

Examples of such photo acid generators (c1) include quinone diazide compounds, sulfonium salts, phosphonium salts, diazonium salts, iodonium salts, and the like. It is preferable to contain two or more photo acid generators, and this enables a photosensitive resin composition having high sensitivity to be obtained. The photo acid generator (c1) is particularly preferably a quinone diazide compound from the viewpoint of the long-term reliability of an organic EL display device in which the below-mentioned cured film according to the present invention is used as a planarization layer and/or insulation layer.

Examples of quinone diazide compounds include: compounds in which the sulfonic acid of a quinone diazide is ester-bonded to a polyhydroxy compound; compounds in which the sulfonic acid of a quinone diazide is sulfonamide-bonded to a polyamino compound; compounds in which the sulfonic acid of a quinone diazide is ester-bonded and/or sulfonamide-bonded to a polyhydroxypolyamino compound; and the like. It is preferable that 50 mol % or more of the whole functional groups of such a polyhydroxy compound or polyamino compound is substituted with the sulfonic acid of a quinone diazide.

Either a 5-naphthoquinone diazide sulfonyl group or a 4-naphthoquinone diazide sulfonyl group is preferably used as a quinone diazide structure. Such a quinone diazide may contain a naphthoquinone diazide sulfonyl ester compound having a 4-naphthoquinone diazide sulfonyl group and a 5-naphthoquinone diazide sulfonyl group in the same molecule, or may contain a 4-naphthoquinone diazide sulfonyl ester compound and a 5-naphthoquinone diazide sulfonyl ester compound. A 4-naphthoquinone diazide sulfonyl ester compound has absorption in the i-line region of the mercury lamp, and is suitable for i-line exposure. A 5-naphthoquinone diazide sulfonyl ester compound has absorption ranging up to the g-line region of the mercury lamp, and is suitable for g-line exposure.

It is preferable that a 4-naphthoquinone diazide sulfonyl ester compound or a 5-naphthoquinone diazide sulfonyl ester compound is selected depending on the wavelength for exposure, and from the viewpoint of higher sensitivity, it is preferable to contain a 4-naphthoquinone diazide sulfonyl ester compound. On the other hand, a 5-naphthoquinone diazide sulfonyl ester compound is preferable from the viewpoint of the long-term reliability of an organic EL display device in which the below-mentioned cured film according to the present invention is used as a planarization layer and/or insulation layer. In the present invention, however, containing the above-mentioned phenolic resin (b) having a halogen atom makes it possible to enhance the long-term reliability, and thus, a 4-naphthoquinone diazide sulfonyl ester compound can be used suitably.

The above-mentioned quinone diazide compound can be synthesized through an arbitrary esterification reaction between a quinone diazide sulfonic acid compound and a compound having a phenolic hydroxyl group. Using such a quinone diazide compound further enhances the resolution, sensitivity, and residual film rate.

Among the photo acid generators (c1), sulfonium salts, phosphonium salts, diazonium salts, and iodonium salts are preferable because they moderately stabilize an acid component generated through exposure. Among others, sulfonium salts are preferable. The compound can further contain a sensitizing agent and the like, if necessary.

In the present invention, the amount of the photo acid generator (c1) is preferably 0.1 parts by mass or more, more preferably 10 parts by mass or more, still more preferably 25 parts by mass or more, with respect to 100 parts by mass of the total of the alkali-soluble resin (a) and the phenolic resin (b), from the viewpoint of higher sensitivity. It is preferably 100 parts by mass or less from the viewpoint of further enhancing the chemical resistance of the cured film. From the viewpoint of enhancing the long-term reliability of an organic EL display device in which the below-mentioned cured film according to the present invention is used as a planarization layer and/or insulation layer, the smaller the amount of the photo acid generator (c1), the more preferable, but in the present invention, containing the above-mentioned phenolic resin (b) having a halogen atom makes it possible to enhance the long-term reliability, and thus, the amount of the photo acid generator (c1) can be increased to increase the sensitivity.

Examples of photo initiator (c2) include benzylketal-based photo initiators, α-hydroxyketone-based photo initiators, α-aminoketone-based photo initiators, acylphosphine oxide-based photo initiators, oxime ester-based photo initiators, acridine-based photo initiators, titanocene-based photo initiators, benzophenone-based photo initiators, acetophenone-based photo initiators, aromatic ketoester-based photo initiators, benzoic acid ester-based photo initiators, and the like. The photosensitive resin composition may contain two or more photo initiators (c2). From the viewpoint of further enhancing the sensitivity, α-aminoketone-based photo initiators, acylphosphine oxide-based photo initiators, and oxime ester-based photo initiators are more preferable.

Examples of α-aminoketone-based photo initiators include 2-methyl-1-[4-(methylthio)phenyl]-2-morpholino-propane-1-one, 2-benzyl-2-dimethyl amino-1-(4-morpholinophenyl)-butane-1-one, 2-dimethylamino-2-(4-methyl benzyl)-1-(4-morpholinophenyl)-butane-1-one, 3,6-bis(2-methyl-2-morpholinopropionyl)-9-octyl-9H-carbazole, and the like.

Examples of acylphosphine oxide-based photo initiators include 2,4,6-trimethylbenzoyl-diphenylphosphine oxide, bis(2,4,6-trimethylbenzoyl)-phenylphosphine oxide, bis(2,6-dimethoxybenzoyl)-(2,4,4-trimethylpentyl)phosphine oxide, and the like.

Examples of oxime ester-based photo initiators include 1-phenylpropane-1,2-dione-2-(O-ethoxycarbonyl)oxime, 1-phenylbutane-1,2-dione-2-(O-methoxycarbonyl)oxime, 1,3-diphenylpropane-1,2,3-trione-2-(O-ethoxycarbonyl)oxime, 1-[4-(phenylthio)phenyl]octane-1,2-dione-2-(O-benzoyl)oxime, 1-[4-[4-(carboxyphenyl)thio]phenyl]propane-1,2-dione-2-(O-acetyl)oxime, 1-[9-ethyl-6-(2-methylbenzoyl)-9H-carbazole-3-yl]ethanone-1-(O-acetyl)oxime, 1-[9-ethyl-6-[2-methyl-4-[1-(2,2-dimethyl-1,3-dioxolane-4-yl)methyloxy]benzoyl]-9H-carbazole-3-yl]ethanone-1-(O-acetyl)oxime, 1-(9-ethyl-6-nitro-9H-carbazole-3-yl)-1-[2-methyl-4-(1-methoxypropane-2-yloxy)phenyl]methanone-1-(O-acetyl)oxime, and the like.

In the present invention, the amount of the photo initiator (c2) is preferably 0.1 parts by mass or more, more preferably 1 parts by mass or more, still more preferably 10 parts by mass or more, with respect to 100 parts by mass of the total of the alkali-soluble resin (a), the phenolic resin (b), and the below-mentioned radical polymerizable compound, from the viewpoint of higher sensitivity. On the other hand, the amount is preferably 50 parts by mass or less from the viewpoint of further enhancing the resolution and decreasing the cone angle. From the viewpoint of enhancing the long-term reliability of an organic EL display device in which the below-mentioned cured film according to the present invention is used as a planarization layer and/or insulation layer, the smaller the amount of the photo acid generator (c2), the more preferable, but in the present invention, containing the above-mentioned phenolic resin (b) having a halogen atom makes it possible to enhance the long-term reliability, and thus, the amount of the photo acid generator (c2) can be increased to increase the sensitivity.

<Radical Polymerizable Compound>

The photosensitive resin composition according to the present invention may further contain a radical polymerizable compound.

A radical polymerizable compound refers to a compound having a plurality of ethylenic unsaturated double bonds in the molecule. During exposure, radicals generated from the above-mentioned photo initiator (c2) cause the radical polymerization of the radical polymerizable compound to progress, resulting in insolubilizing the light-irradiated portions to afford a negative-working type pattern. Further containing a radical polymerizable compound makes it possible to promote the photo-setting of the light-irradiated portions to further enhance the sensitivity. In addition, containing a radical polymerizable compound enhances the crosslinking density after thermal curing, and thus, makes it possible to enhance the hardness of the cured film.

As a radical polymerizable compound, a compound having a (meth)acryl group is preferable because this compound advances radical polymerization more easily. Compounds having two or more (meth)acryl groups in the molecule are more preferable from the viewpoint of enhancing the sensitivity during exposure and enhancing the hardness of the cured film. The double bond equivalent of the radical polymerizable compound is preferably 80 to 400 g/mol from the viewpoint of enhancing the sensitivity during exposure and enhancing the hardness of the cured film.

Examples of radical polymerizable compounds include trimethylolpropane tri(meth)acrylate, ditrimethylolpropane tri(meth)acrylate, ditrimethylolpropane tetra(meth)acrylate, pentaerythritol tri(meth)acrylate, pentaerythritol tetra(meth)acrylate, dipentaerythritol penta(meth)acrylate, dipentaerythritol hexa(meth)acrylate, tripentaerythritol hepta(meth)acrylate, tripentaerythritol octa(meth)acrylate, 2,2-bis[4-(3-(meth)acryloxy-2-hydroxy propoxy)phenyl]propane, 1,3,5-tris((meth)acryloxyethyl)isocyanuric acid, 1,3-bis((meth)acryloxyethyl)isocyanuric acid, 9,9-bis[4-(2-(meth)acryloxyethoxy)phenyl]fluorene, 9,9-bis[4-(3-(meth)acryloxypropoxy)phenyl]fluorene, 9,9-bis(4-(meth)acryloxyphenyl)fluorene, acid-modified products thereof, ethylene oxide-modified products thereof, propylene oxide-modified products thereof, and the like.

In the resin composition according to the present invention, the amount of the radical polymerizable compound is preferably 15 parts by mass or more, more preferably 30 parts by mass or more, with respect to 100 parts by mass of the total of the alkali-soluble resin (a) and the radical polymerizable compound, from the viewpoint of further enhancing the sensitivity and decreasing the cone angle. On the other hand, the amount is preferably 65 parts by mass or less, more preferably 50 parts by mass or less, from the viewpoint of further enhancing the heat resistance of the cured film and decreasing the cone angle.

<Thermal Crosslinking Agent (d)>

The photosensitive resin composition according to the present invention may further contain a thermal crosslinking agent (d). A thermal crosslinking agent (d) refers to a compound having, in the molecule, at least two thermally reactive functional groups such as an alkoxymethyl group, methylol group, epoxy group, and oxetanyl group. Containing a thermal crosslinking agent (d) makes it possible that the alkali-soluble resin (a) or another additive component is crosslinked to enhance the heat resistance, chemical resistance, and bending resistance of the film obtained after thermal curing.

Preferable examples of compounds having at least two alkoxy methyl groups or methylol groups include: DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, and HMOM-TPHAP (which are all tradenames and manufactured by Honshu Chemical Industry Co., Ltd.); and "NIKALAC" (registered trademark) MX-290, "NIKALAC" MX-280, "NIKALAC" MX-270, "NIKALAC" MX-279, "NIKALAC" MW-100LM, and "NIKALAC" MX-750LM (which are all tradenames and manufactured by Sanwa Chemical Co., Ltd.).

Preferable examples of compounds having at least two epoxy groups include: "EPOLIGHT" (registered trademark) 40E, "EPOLIGHT" 100E, "EPOLIGHT" 200E, "EPOLIGHT" 400E, "EPOLIGHT" 70P, "EPOLIGHT" 200P, "EPOLIGHT" 400P, "EPOLIGHT" 1500NP, "EPOLIGHT" 80MF, "EPOLIGHT" 4000, and "EPOLIGHT" 3002 (which are all manufactured by Kyoeisha Chemical Co., Ltd.); "DENACOL" (registered trademark) EX-212L, "DENACOL" EX-214L, "DENACOL" EX-216L, and "DENACOL" EX-850L (which are all manufactured by Nagase ChemteX Corporation); GAN and GOT (which are manufactured by Nippon Kayaku Co., Ltd.); "EPIKOTE" (registered trademark) 828, "EPIKOTE" 1002, "EPIKOTE" 1750, "EPIKOTE" 1007, YX8100-BH30, E1256, E4250, and E4275 (which are all manufactured by Japan Epoxy Resin Co., Ltd.); "EPICLON" (registered trademark) EXA-9583 and HP4032 (which are manufactured by DIC Corporation); VG3101 (manufactured by Mitsui Chemicals, Inc.); "TEPIC" (registered trademark) S, "TEPIC" G, and "TEPIC" P (which are all manufactured by Nissan Chemical Corporation); "DENACOL" EX-321L (manufactured by Nagase ChemteX Corporation); NC6000 (manufactured by Nippon Kayaku Co., Ltd.); "EPOTOHTO" (registered trademark) YH-434L (manufactured by Tohto Kasei Co., Ltd.); EPPN502H and NC3000 (manufactured by Nippon Kayaku Co., Ltd.); "EPICLON" (registered trademark) N695 and HP7200 (which are all manufactured by DIC Corporation); and the like.

Preferable examples of compounds having at least two oxetanyl groups include: ETERNACOLL EHO, ETERNACOLL OXBP, ETERNACOLL OXTP, and ETERNACOLL OXMA (which are all manufactured by Ube Industries, Ltd.); oxetanized phenol novolacs; and the like.

The photosensitive resin composition may contain two or more thermal crosslinking agents (d) in combination.

The amount of the thermal crosslinking agent (d) is preferably 1 part by mass or more and 30 parts by mass or less with respect to 100 parts by mass of the total amount of the resin composition excluding a solvent. Containing the thermal crosslinking agent (d) in an amount of 1 part by mass or more makes it possible to further enhance the chemical resistance and bending resistance of the cured film. In addition, containing the thermal crosslinking agent (d) in an amount of 30 parts by mass or less makes it possible to further decrease the amount of outgassing from the cured film and to further enhance the long-term reliability of the organic EL display device, and also causes the resin composition to have excellent storage stability.

<Solvent>

The photosensitive resin composition according to the present invention may further contain a solvent. Containing a solvent makes it possible to become varnish and makes it possible to enhance the coatability.

Examples of solvents include: polar aprotic solvents such as γ-butyrolactone; ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane; ketones such as acetone, methylethyl ketone, diisobutyl ketone, cyclohexanone, 2-heptanone, 3-heptanone, and diacetone alcohol; esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methoxybutyl acetate, 3-methyl-3-methoxybutyl acetate, 3-methyl-3-methoxybutyl propionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; amides such as N-methylpyrrolidone, N,N-dimethylformamide, N,N-dimethylacetamide, 3-methoxy-N,N-dimethylpropionamide, 3-butoxy-N,N-dimethylpropionamide, N,N-dimethylpropaneamide, and N,N-dimethylisobutylamide; 3-methyl-2-oxazolidinone; and the like. The photosensitive resin composition may contain two or more of these.

Without particular limitation, the amount of the solvent is preferably 100 to 3000 parts by mass, more preferably 150 to 2000 parts by mass, with respect to 100 parts by mass of the total amount of the photosensitive resin composition excluding the solvent. In addition, the ratio of a solvent having a boiling point of 180° C. or more to the total amount of the solvent is preferably 20 parts by mass or less, more preferably 10 parts by mass or less. Causing the ratio of a solvent having a boiling point of 180° C. or more to be 20 parts by mass or less makes it possible to further decrease the amount of outgassing generated after thermal curing, and makes it possible to further enhance the long-term reliability of the organic EL device.

<Adhesion Promoter>

The photosensitive resin composition according to the present invention may further contain an adhesion promoter. Examples of adhesion promoters include: silane coupling agents such as vinyltrimethoxy silane, vinyltriethoxy silane, epoxycyclohexylethyltrimethoxy silane, 3-glycidoxypropyltrimethoxy silane, 3-glycidoxypropyltriethoxy silane, p-styryltrimethoxy silane, 3-aminopropyltrimethoxy silane, 3-aminopropyltriethoxy silane, and N-phenyl-3-aminopropyltrimethoxy silane; titanium chelating agents; aluminum chelating agents; compounds obtained by allowing an aromatic amine compound to react with a silicon compound containing an alkoxy group; and the like. The photosensitive resin composition may contain two or more of these. Containing such an adhesion promotor makes it possible that a resin film used for development and the like has higher development adhesion to an underlying base material such as a silicon wafer, ITO, $SiO_2$, or silicon nitride. In addition, containing such an adhesion promotor can enhance resistance to oxygen plasma used for cleaning and the like and to UV ozone processing. The amount of the adhesion promotor is preferably 0.1 to 10 parts by mass with respect to 100 parts by mass of the total amount of the resin composition excluding a solvent.

<Surfactant>

The photosensitive resin composition according to the present invention may further contain a surfactant, if necessary, and thereby can enhance the wettability with a substrate. Examples of surfactants include: fluorine-based surfactants such as SH series, SD series, and ST series from Toray Dow Coning Co., Ltd., BYK series from BYK Japan KK, KP series from Shin-Etsu Chemical Co., Ltd., DISFOAM series from NOF Corporation, "MEGAFAC (registered trademark)" series from DIC Corporation, FLUORAD series from Sumitomo 3M Limited, "SURFLON (registered trademark)" series and "ASAHIGUARD (registered trademark)" series from Asahi Glass Co., Ltd., and PolyFox series from Omnova Solutions Inc.; acryl-based and/or methacryl-based surfactants such as POLYFLOW series from Kyoeisha Chemical Co., Ltd. and "DISPARLON (registered trademark)" series from Kusumoto Chemicals, Ltd.; and the like.

The amount of the surfactant is preferably 0.001 to 1 part by mass with respect to 100 parts by mass of the total amount of the resin composition excluding a solvent.

<Phenolic Compound Having a Phenolic Hydroxyl Group and Having a Molecular Weight of 100 or More and Less than 500>

The photosensitive resin composition according to the present invention may contain a phenolic compound having a phenolic hydroxyl group and having a molecular weight of 100 or more and less than 500 for the purpose of supplying alkaline developability for the photosensitive resin composition. Examples of phenolic compounds having a phenolic hydroxyl group include: Bis-Z, BisOC-Z, BisOPP-Z, BisP-CP, Bis26X-Z, BisOTBP-Z, BisOCHP-Z, BisOCR-CP, BisP-MZ, BisP-EZ, Bis26X-CP, BisP-PZ, BisP-IPZ, BisCRIPZ, BisOCP-IPZ, BisOIPP-CP, Bis26X-IPZ, BisOTBP-CP, TekP-4HBPA(tetrakis P-DO-BPA), TrisPHAP, TrisP-PA, TrisP-PHBA, TrisP-SA, TrisOCR-PA, BisOFP-Z, BisRS-2P, BisPG-26X, BisRS-3P, BisOC-OCHP, BisPC-OCHP, Bis25X-OCHP, Bis26X-OCHP, BisOCHP-OC, Bis236T-OCHP, methylenetris-FR-CR, BisRS-26X, and BisRS-OCHP, (which are tradenames and manufactured by Honshu Chemical Industry Co., Ltd.); BIR-OC, BIP-PC, BIR-PC, BIR-PTBP, BIR-PCHP, BIP-BIOC-F, 4PC, BIR-BIPC-F, and TEP-BIP-A (which are all tradenames and manufactured by Asahi Yukizai Corporation); 1,4-dihydroxynaphthalene, 1,5-dihydroxynaphthalene, 1,6-dihydroxynaphthalene, 1,7-dihydroxynaphthalene, 2,3-dihydroxynaphthalene, 2,6-dihydroxynaphthalene, 2,7-dihydroxynaphthalene, 2,4-dihydroxyquinoline, 2,6-dihydroxyquinoline, 2,3-dihydroxyquinoxaline, anthracene-1,2,10-triol, anthracene-1,8,9-triol, 8-quinolinol, bisphenol A, bisphenol F, bisphenol Z, bisphenol E, bisphenol C, bisphenol G, bisphenol M, bisphenol P, bisphenol PH, bisphenol TMC, 2-fluorophenol, 3-fluorophenol, 4-fluorophenol, 2,4-difluorophenol, 2,6-difluorophenol, 3,4-difluorophenol, 3,5-difluorophenol, 2,4,6-trifluorophenol, 3,4,5-trifluorophenol, 2,3,5,6-tetrafluorophenol, pentafluorophenol, 2,3,5,6-tetrafluoro-4-trifluoromethylphenol, 2,3,5,6-tetrafluoro-4-pentafluorophenylphenol, perfluoro-1-naphthol, perfluoro-2-naphthol, 2-chlorophenol, 3-chlorophenol, 4-chlorophenol, 2,4-dichlorophenol, 2,6-dichlorophenol, 3,4-dichlorophenol, 3,5-dichlorophenol, 2,4,6-trichlorophenol, 3,4,5-trichlorophenol, 2,3,5,6-tetrachlorophenol, pentachlorophenol, 2,3,5,6-tetrachloro-4-trichloromethylphenol, 2,3,5,6-tetrachloro-4-pentachlorophenylphenol, perchloro-1-naphthol, perchloro-2-naphthol, 2-bromophenol, 3-bromophenol, 4-bromophenol, 2,4-dibromophenol, 2,6-dibromophenol, 3,4-dibromophenol, 3,5-dibromophenol, 2,4,6-tribromophenol, 3,4,5-tribromophenol, 2,3,5,6-tetrabromophenol, pentabromophenol, 2,3,5,6-tetrabromo-4-tribromomethylphenol, 2,3,5,6-tetrabromo-4-pentabromophenylphenol, perbromo-1-naphthol, perbromo-2-naphthol, 2-iodophenol, 3-iodophenol, 4-iodophenol, 2,4-diiodophenol, 2,6-diiodophenol, 3,4-diiodophenol, 3,5-diiodophenol, 2,4,6-triiodophenol, 3,4,5-triiodophenol, 2,3,5,6-tetraiodophenol, pentaiodophenol, 2,3,5,6-tetraiodo-4-triiodomethylphenol, 2,3,5,6-tetraiodo-4-pentaiodophenylphenol, periodo-1-naphthol, periodo-2-naphthol, 2-(trifluoromethyl)phenol, 3-(trifluoromethyl)phenol, 4-(trifluoromethyl)phenol, 2,6-bis(trifluoromethyl)phenol, 3,5-bis(trifluoromethyl)phenol, 2,4,6-tris(trifluoromethyl)phenol, 2-cyanophenol, 3-cyanophenol, 4-cyanophenol, 2-nitrophenol, 3-nitrophenol, 4-nitrophenol, 2-hydroxyacetophenone, 3-hydroxyacetophenone, 4-hydroxyacetophenone, salicyl acid, methyl salicylate, bisphenol AF, bisphenol S, 2,2'-dihydroxybenzophenone, 4,4'-dihydroxybenzophenone, 2,4-dihydroxybenzophenone, 3,4-dihydroxybenzophenone, 2,3,4-trihydroxybenzophenone, 2,4,4'-trihydroxybenzophenone, 2,3,4,4'-tetrahydroxybenzophenone, and 2,2',4,4'-tetrahydroxybenzophenone; and the like. Containing such a compound having a phenolic hydroxyl group makes it possible that the resulting photosensitive resin composition is hardly dissolved in an alkaline developer before exposure, and is easily dissolved in the alkaline developer after exposure, thus leading to a decreased film loss during development and ensuring easy development in a short time. Accordingly, the sensitivity can be enhanced easily.

The phenolic compound having a phenolic hydroxyl group and having a molecular weight of 100 or more and less than 500 preferably further has an electron-withdrawing group from the viewpoint of enhancing the long-term reliability of an organic EL display device in which the below-mentioned cured film according to the present invention is used as a planarization layer and/or insulation layer.

In the present invention, an "electron-withdrawing group" refers to a group the substituent constant, $\sigma_p^0$ value, of which is positive, as defined in Handbook of Chemistry: Pure Chemistry, 5th ed., II-379 to II-380 (compiled by The Chemical Society of Japan, published by Maruzen Publishing Co., Ltd.). Specific examples thereof include halogen atoms, cyano groups, oxy groups, carbonyl groups, carbonyloxy groups, oxycarbonyl groups, nitril groups, nitro groups, sulfonyl groups, sulfinyl groups, halo(cyclo)alkyl groups, haloaryl groups, and combinations thereof. In this regard, a halo(cyclo)alkyl group refers to an alkyl group or cycloalkyl group at least a part of which is halogenated, and a haloaryl group refers to an aryl group at least a part of which is halogenated.

Specific examples of phenolic compounds (e) having an electron-withdrawing group and a phenolic hydroxyl group and having a molecular weight of 100 or more and less than 500 include 2-fluorophenol, 3-fluorophenol, 4-fluorophenol, 2,4-difluorophenol, 2,6-difluorophenol, 3,4-difluorophenol, 3,5-difluorophenol, 2,4,6-trifluorophenol, 3,4,5-trifluorophenol, 2,3,5,6-tetrafluorophenol, pentafluorophenol, 2,3,5,6-tetrafluoro-4-trifluoromethylphenol, 2,3,5,6-tetrafluoro-4-pentafluorophenylphenol, perfluoro-1-naphthol, perfluoro-2-naphthol, 2-chlorophenol, 3-chlorophenol, 4-chlorophenol, 2,4-dichlorophenol, 2,6-dichlorophenol, 3,4-dichlorophenol, 3,5-dichlorophenol, 2,4,6-trichlorophenol, 3,4,5-trichlorophenol, 2,3,5,6-tetrachlorophenol, pentachlorophenol, 2,3,5,6-tetrachloro-4-trichloromethylphenol, 2,3,5,6-tetrachloro-4-pentachlorophenylphenol, perchloro-1-naphthol, perchloro-2-naphthol, 2-bromophenol, 3-bromophenol, 4-bromophenol, 2,4-dibromophenol, 2,6-dibromophenol, 3,4-dibromophenol, 3,5-dibromophenol, 2,4,6-tribromophenol, 3,4,5-tribromophenol, 2,3,5,6-tetrabromophenol, pentabromophenol, 2,3,5,6-tetrabromo-4-tribromomethylphenol, 2,3,5,6-tetrabromo-4-pentabromophenylphenol, perbromo-1-naphthol, perbromo-2-naphthol, 2-iodophenol, 3-iodophenol, 4-iodophenol, 2,4-diiodophenol, 2,6-diiodophenol, 3,4-diiodophenol, 3,5-diiodophenol, 2,4,6-triiodophenol, 3,4,5-triiodophenol, 2,3,5,6-tetraiodophenol, pentaiodophenol, 2,3,5,6-tetraiodo-4-triiodomethylphenol, 2,3,5,6-tetraiodo-4-pentaiodophenylphenol, periodo-1-naphthol, periodo-2-naphthol, 2-(trifluoromethyl)phenol, 3-(trifluoromethyl)phenol, 4-(trifluoromethyl)phenol, 2,6-bis(trifluoromethyl)phenol, 3,5-bis(trifluoromethyl)phenol, 2,4,6-tris(trifluoromethyl)phenol, 2-cyanophenol, 3-cyanophenol, 4-cyanophenol, 2-nitrophenol, 3-nitrophenol, 4-nitrophenol, 2-hydroxyacetophenone, 3-hydroxyacetophenone, 4-hydroxyacetophenone, salicyl acid, methyl salicylate, bisphenol AF, bisphenol S, 2,2'-dihydroxybenzophenone, 4,4'-dihydroxybenzophenone, 2,4-dihydroxybenzophenone, 3,4-dihydroxybenzophenone, 2,3,4-trihydroxybenzophenone, 2,4,4'-trihydroxybenzophenone, 2,3,4,4'-tetrahydroxybenzophenone, 2,2',4,4'-tetrahydroxybenzophenone, and the like. These can be used singly or in mixture thereof.

The phenolic compound (e) having an electron-withdrawing group and a phenolic hydroxyl group and having a molecular weight of 100 or more and less than 500 is preferably a bisphenol from the viewpoint of the heat resistance of the phenolic compound having a phenolic hydroxyl group. Examples of bisphenols include bisphenol AF, bisphenol S, 2,2'-dihydroxybenzophenone, 4,4'-dihydroxybenzophenone, 2,4-dihydroxybenzophenone, 3,4-dihydroxybenzophenone, 2,3,4-trihydroxybenzophenone, 2,4,4'-trihydroxybenzophenone, 2,3,4,4'-tetrahydroxybenzophenone, 2,2',4,4'-tetrahydroxybenzophenone, and the like.

The amount of such a phenolic compound having a phenolic hydroxyl group and having a molecular weight of 100 or more and less than 500 is preferably 1 part by mass or more and 20 parts by mass or less with respect to 100 parts by mass of the alkali-soluble resin (a). This range makes it possible to maintain high heat resistance and at the same time, enhance the alkaline developability of the photosensitive resin composition.

<Inorganic Particles>

The photosensitive resin composition according to the present invention may further contain inorganic particles. Preferable specific examples of inorganic particles include inorganic particles of silicon oxide, titanium oxide, barium titanate, alumina, talc, or the like. Such inorganic particles preferably have a primary particle diameter of 100 nm or less, more preferably 60 nm or less.

The amount of the inorganic particles is preferably 5 to 90 parts by mass with respect to 100 parts by mass of the total amount of the resin composition excluding a solvent.

<Thermal Acid Generator>

The photosensitive resin composition according to the present invention may further contain a thermal acid generator to the extent that the long-term reliability of the organic EL display device is not impaired. A thermal acid generator is heated to generate acid and promote the crosslinking reaction of the thermal crosslinking agent. Besides, in cases where the resin of the component (a) has an unclosed imide ring structure or an oxazole ring structure, such a thermal acid generator promotes the cyclization of such a structure, and makes it possible to further enhance the mechanical characteristics of the cured film.

The thermal decomposition onset temperature of a thermal acid generator used in the present invention is preferably 50° C. to 270° C., more preferably 250° C. or less. In addition, selecting a thermal acid generator makes it possible to inhibit a decrease in sensitivity during development, and thus, is preferable, wherein such a selected thermal acid generator generates no acid when a resin composition according to the present invention is applied to a substrate and then dried (prebaked at approximately 70 to 140° C.), and generates acid when the resin composition is subjected to final heating (cured at approximately 100 to 400° C.) after the drying and the subsequent patterning carried out through exposure and development.

An acid generated from a thermal acid generator used in the present invention is preferably a strong acid, which is preferably, for example; an arylsulfonic acid such as p-toluene sulfonic acid or benzenesulfonic acid; an alkylsulfonic acid such as methanesulfonic acid, ethanesulfonic acid, propanesulfonic acid, or butanesulfonic acid; a haloalkylsulfonic acid such as trifluoromethylsulfonic acid; or the like. These are used as a salt such as an onium salt, or as a covalently bonded compound such as an imide sulfonate. The photosensitive resin composition may contain two or more of these.

The amount of the thermal acid generator is preferably 0.01 parts by mass or more, more preferably 0.1 parts by mass or more, with respect to 100 parts by mass of the total amount of the resin composition excluding a solvent. Containing the thermal acid generator in an amount of 0.01 parts by mass or more promotes crosslinking reaction and the cyclization of the unclosed structure of the resin, and thus, makes it possible to further enhance the mechanical characteristics and chemical resistance of the cured film. In addition, the amount is preferably 5 parts by mass or less, more preferably 2 parts by mass or less, from the viewpoint of the long-term reliability of the organic EL display device.

<Method of Producing Photosensitive Resin Composition>

Next, a method of producing a photosensitive resin composition according to the present invention will be described. For example, a photosensitive resin composition can be obtained by dissolving an alkali-soluble resin (a), a phenolic resin (b), a photosensitive compound (c), and, if necessary, a radical polymerizable compound, a thermal crosslinking agent, a solvent, an adhesion promoter, a surfactant, a phenolic compound having a phenolic hydroxyl group and having a molecular weight of 100 or more and less than 500, inorganic particles, a thermal acid generator, and/or the like.

The dissolution can be carried out by stirring, heating, or the like. In cases where the materials are heated, the heating temperature is preferably set to the extent that the performance of the photosensitive resin composition is not impaired, and such a temperature is commonly in the range of from room temperature to 80° C. In addition, dissolving these components is not limited to any particular order, and for example, the compounds are dissolved in order of solubility from low to high. In addition, those components, such as a surface active agent or some adhesion promotors, which is/are likely to form bubbles when dissolved by stirring can be added finally after the other components are dissolved. Thus, the other components will be prevented from insufficient dissolution caused by bubble formation.

The obtained photosensitive resin composition is preferably filtered through a filter so that dust and particles can be removed from the composition. Such a filter has a pore size of, for example, 0.5 μm, 0.2 μm, 0.1 μm, 0.07 μm, 0.05 μm, or 0.02 μm, without limitation to these. The filter to be used for the filtration may be of such a material as polypropylene (PP), polyethylene (PE), nylon (NY), or polytetrafluoroethylene (PTFE), of which polyethylene and nylon are preferable.

<Photosensitive Resin Sheet>

A photosensitive resin sheet according to the present invention is formed using the photosensitive resin composition.

Such a sheet according to the present invention can be obtained, for example, by applying the above-mentioned photosensitive resin compositions to a releasable base material such as of polyethylene terephthalate to obtain a coating film of the photosensitive resin composition, and then drying the coating film. A protective film may further be laminated on the resulting film.

Examples of coating methods include a spin coating method, slit coating method, dip coating method, spray coating method, printing method, and the like. Among these, a slit coating method is preferable in that a small amount of coating liquid can serve for coating and in that this method is advantageous for cost decrease. The amount of coating liquid needed by a slit coating method is, for example, approximately ⅕ to 1/10 of that for a spin coating method. A slit nozzle to be used for coating can be selected from those placed on the market by a plurality of manufacturers. Examples of slit nozzles include "Linear Coater", manufactured by Dainippon Screen Mfg. Co., Ltd., "Spinless" manufactured by Tokyo Ohka Kogyo Co., Ltd., "TS Coater" manufactured by Toray Engineering Co., Ltd., "Table Coater" manufactured by Chugai Ro Co., Ltd., "CS series" and "CL series" manufactured by Tokyo Electron Limited, "In-line type Slit Coater" manufactured by Thermatronics Boeki K.K., "Head Coater HC series" manufactured by Hirata Corporation, and the like. The coating speed is generally in the range of from 10 mm/second to 400 mm/second. The film thickness of the coating film varies depending on the solid content, viscosity, and the like of the resin composition, and the coating is carried out so that the film thickness obtained after drying can usually be 0.1 to 10 μm, preferably 0.3 to 5 μm.

Before being coated, a base material to be coated with the photosensitive resin composition may preliminarily be pre-treated with the above-mentioned adhesion promoter. Examples of such pretreatment methods include a method in which an adhesion promotor is dissolved in an amount of 0.5 to 20 mass % in a solvent such as isopropanol, ethanol, methanol, water, tetrahydrofuran, propylene glycol monomethyl ether acetate, propylene glycol monomethyl ether, ethyl lactate, or diethyl adipate to prepare a solution, which is then used to treat the surface of a base material. Examples of methods of treating the surface of a base material include a spin coating method, slit die coating method, bar coating method, dip coating method, spray coating method, steaming method, and the like.

After the coating, the coating film is generally dried under reduced pressure, if necessary, and dried by heating. This step is also referred to as prebaking. A hot plate, oven, infrared ray, or the like is used for drying. In cases where a hot plate is used, the coating film is placed directly on the plate or held on jigs such as proxy pins mounted on the plate, and then, is heated. Examples of materials of such proxy pins include: metal materials such as aluminium and stainless steel; and synthetic resins such as polyimide resins and "TEFLON" (registered trademark). A proxy pin of any material may be used provided that the material has heat resistance. The height of the proxy pin varies depending on the size of a base material, the type of a coating film, the purpose of heating, and the like, and is preferably approximately 0.1 to 10 mm. The heating temperature and the heating time vary depending on the type and purpose of the coating film, and it is preferable that the heating temperature is 50° C. to 180° C., and that the heating time is one minute to several hours.

The photosensitive resin sheet can be patterned. For example, a photosensitive resin sheet is irradiated with actinic rays passing through a mask having a desired pattern, so that the sheet is exposed. Thus, the sheet can be developed to have a desired pattern formed thereon.

Examples of actinic rays to be used for exposure include ultraviolet rays, visible rays, electron rays, X-rays, and the like. In the present invention, the i-line (365 nm), h-line (405 nm), and g-line (436 nm) of the mercury lamp are preferably used. If the film is positively photosensitive, the exposed parts are dissolved by a developer. If the film is negatively photosensitive, the exposed parts harden and become insoluble in a developer.

After the exposure, a developer is used to remove the exposed parts of a positive-working film or the unexposed parts of a negative-working film to form a desired pattern. Examples of preferable developers include aqueous solutions of a compound exhibiting alkalinity, such as tetramethylammonium hydroxide, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylamino ethanol, dimethylaminoethyl methacrylate, cyclohexylamine, ethylene diamine, or hexamethylene diamine. To such an alkali aqueous solution, one or more of; polar solvents such as N-methyl-2-pyrrolidone, N,N-dimethylformamide, N,N-dimethylacetamide, dimethylsulfoxide, γ-butyrolactone, and dimethylacrylamide; alcohols such as methanol, ethanol, and isopropanol; esters such as ethyl lactate and propylene glycol monomethyl ether acetate; ketones such as cyclopentanone, cyclohexanone, isobutyl ketone, and methylisobutyl ketone; and the like may be added. Examples of development methods include methods such as spraying, paddling, immersion, and ultrasonication.

Next, the pattern formed through development is preferably rinsed with distilled water. To distilled water for the rinsing treatment, an alcohol such as ethanol or isopropyl alcohol, an ester such as ethyl lactate or propylene glycol monomethyl ether acetate, or the like may be added.

<Cured Film>

A cured film according to the present invention can be obtained by curing the photosensitive resin sheet or photosensitive resin composition. Thermally curing the photosensitive resin composition or photosensitive resin sheet makes it possible to remove a component having low heat resistance, and thus, makes it possible to further enhance the heat resistance and chemical resistance. In particular, in cases where the photosensitive resin composition or photosensitive resin sheet according to the present invention contains a polyimide precursor, polybenzoxazole precursor, copolymer thereof, or copolymer of any of these and a polyimide, such a component forms an imide ring or oxazole ring through thermal curing, thus making it possible to further enhance the heat resistance and chemical resistance.

The thermal curing temperature is preferably 180° C. or more, more preferably 200° C. or more, still more preferably 230° C. or more, particularly preferably 250° C. or more, from the viewpoint of further decreasing the amount of outgassing generated from the cured film. On the other hand, the temperature is preferably 500° C. or less, more preferably 450° C. or less, from the viewpoint of enhancing the film toughness of the cured film. Within this range, the temperature may be raised stepwise or may be raised continuously. The thermal curing time is preferably 30 minutes or more from the viewpoint of further decreasing the amount of outgassing. In addition, the time is preferably three hours or less from the viewpoint of enhancing the film toughness of the cured film. Examples of such methods include: a method in which heat-treatment is carried out at 150° C. and 250° C. for 30 minutes each; a method in which heat-treatment is carried out with the temperature linearly raised from room temperature to 300° C. over two hours; and the like.

A photosensitive resin composition, photosensitive resin sheet, and cured film according to the present invention are suitably used for; a surface protective layer and interlayer insulation layer of a semiconductor element; an insulation layer of an organic electroluminescence (hereinafter referred to as EL) element; a planarization layer of a thin film transistor (hereinafter referred to as TFT) substrate for driving of a display device with an organic EL element used therein; a wiring protection insulation layer of a circuit substrate; an on-chip microlens of a solid state image sensor; and a planarization layer for any of various displays and solid state image sensors. For example, the composition, sheet, and cured film are suitable for a surface protective layer and interlayer insulation layer of: MRAM having low heat resistance; a polymer ferroelectric RAM (PFRAM), a phase change RAM (PCRAM), and an Ovonics unified memory (OUM), which are promising as next generation memories; and the like. In addition, the composition, sheet, and cured film can be used for an insulation layer of a display device containing a first electrode formed on a substrate and a second electrode opposed to the first electrode, for example, an LCD, ECD, ELD, a display device with an organic electroluminescent element (organic electroluminescence device) used therein, or the like. Below, an organic EL display device, semiconductor device, and semiconductor electronic component will be described as examples.

<Organic EL Display Device>

A cured film according to the present invention can suitably be used for a planarization layer and/or insulation layer in an organic EL display device having a driving circuit, a planarization layer, a first electrode, an insulation layer, a light-emitting layer, and a second electrode on a substrate. An organic light-emitting material is generally vulnerable to a gas component and moisture, and when exposed to these, the material decreases in the light-emitting brightness and causes pixel shrinkage. Pixel shrinkage refers to a phenomenon in which more pixels have lower light-emitting brightness or are not lighted nearer to the end of a pixel region. Containing a cured film according to the present invention as a planarization layer and/or insulation layer of an organic EL display device makes it possible to enhance the long-term reliability. In particular, an insulation layer is adjacent to an organic light-emitting material, and thus, has a larger influence on the long-term reliability than a planarization layer, and a cured film according to the present invention is preferably contained in at least an insulation layer in order to obtain an organic EL display device having high long-term reliability.

Taking an active matrix type of display device for example, a TFT and a wiring located on the lateral of the TFT and connected to the TFT are on a substrate such as of glass or any of various plastic materials, a planarization layer is on the resulting piece so as to cover the irregularities, and a display element is further mounted on the planarization layer. The display element and the wiring are connected via contact holes formed in the planarization layer. In particular, making an organic EL display device flexible is the mainstream in recent years, and the above-mentioned substrate having a driving circuit is preferably an organic EL display device containing a resin film. A cured film obtained by curing a photosensitive resin composition or photosensitive sheet according to the present invention is particularly preferably used as an insulation layer and/or planarization layer of such a flexible display because such usage affords excellent bending resistance. Such a resin film is particularly preferably a polyimide from the viewpoint of enhancing the adhesion with a cured film obtained by curing a photosensitive resin composition or photosensitive sheet according to the present invention.

The film thickness of a cured film according to the present invention used as the planarization layer is preferably 1.0 to 5.0 µm, more preferably 2.0 µm or more. Having a planarization layer within the above-mentioned range makes it possible to enhance the flatness of the TFTs and wiring which are densely packaged for the sake of higher definition. Having a thick film as a planarization layer causes outgassing to increase and causes the long-term reliability of the organic EL display device to decrease, but a cured film according to the present invention makes it possible to enhance the long-term reliability even in cases where the cured film is formed into a thick film. In addition, the planarization layer is preferably multilayered because such a layer makes it possible to dispose TFTs and wiring in the film thickness direction for the sake of higher definition. The multilayer has, for example, two to five layers.

In an organic EL display device according to the present invention, at least a part of the portion including the cured film preferably has a bendable portion and/or a bent and fixed portion. Using a cured film obtained by curing a photosensitive resin composition or photosensitive resin sheet according to the present invention makes it possible to obtain an organic EL display device having excellent bending resistance. The curvature radius of the bendable portion and/or bent and fixed portion is preferably 0.1 mm or more, preferably 5 mm or less. The curvature radius of 0.1 mm or more makes it possible to enhance the bending resistance of the bent portion, and 5 mm or less makes it possible to enhance the design properties such as a slim border. The organic EL display device according to the present invention is bendable at an arbitrary suitable part thereof. For example, the organic EL display device may be bendable at the central position thereof as with a display device of a foldable type, or may be bendable at the end thereof from the viewpoint of increasing the design properties and a display screen maximally. Furthermore, the organic EL display device may be bendable along the longer length direction, and may be bendable along the shorter length direction. It is only necessary, in accordance with the application, that a specific portion of the organic EL display device is bendable (for example, any one or more or all of the four corners is/are obliquely bendable).

FIG. 1 depicts a cross-sectional view of an example of a TFT substrate. A bottom-gate type or top-gate type of TFT (thin film transistor) 1 is provided in matrix form on a substrate 6, and a TFT insulation layer 3 is formed, covering this TFT 1. In addition, a wiring 2 connected to the TFT 1 is provided on this TFT insulation layer 3. Furthermore, a planarization layer 4 is formed on the TFT insulation layer 3 with the wiring 2 embedded in the planarization layer. A contact hole 7 reaching the wiring 2 is provided in the planarization layer 4. Then, an ITO (transparent electrode) 5 is formed, connected to the wiring 2 via the contact hole 7, on the planarization layer 4. Here, the ITO 5 serves as an electrode of a display element (for example, an organic EL element). Then, an insulation layer 8 is formed so as to cover the outer edge of the ITO 5. The organic EL element may be of a top emission type which discharges emitted light out of the opposite side from the substrate 6 side, or may be of a bottom emission type which takes light out of the substrate 6 side. In this manner, an active matrix type of organic EL display device is obtained, in which a TFT 1 for driving each organic EL element is connected to the element.

Such a TFT insulation layer 3, planarization layer 4, and/or insulation layer 8 can be formed as in the above-mentioned manner by the steps of: forming a photosensitive resin film composed of a photosensitive resin composition or photosensitive resin sheet according to the present invention; exposing the photosensitive resin film; developing the exposed photosensitive resin film; and heating the developed photosensitive resin film. A producing method including these steps makes it possible to obtain an organic EL display device.

<Semiconductor Electronic Component and Semiconductor Device>

A cured film according to the present invention can suitably be used for an interlayer insulation layer and/or surface protective layer in a semiconductor electronic component or semiconductor device having an electrode, a metal wiring, the interlayer insulation layer, and/or the surface protective layer on a substrate. At least a part of the interlayer insulation layer and/or surface protective layer can contain a cured film according to the present invention. A cured film according to the present invention has excellent mechanical characteristics, and thus, makes it possible to relax stress generated from encapsulation resin during packaging, inhibit damage to a low-k layer, and provide a highly reliable semiconductor device.

Figure 2:
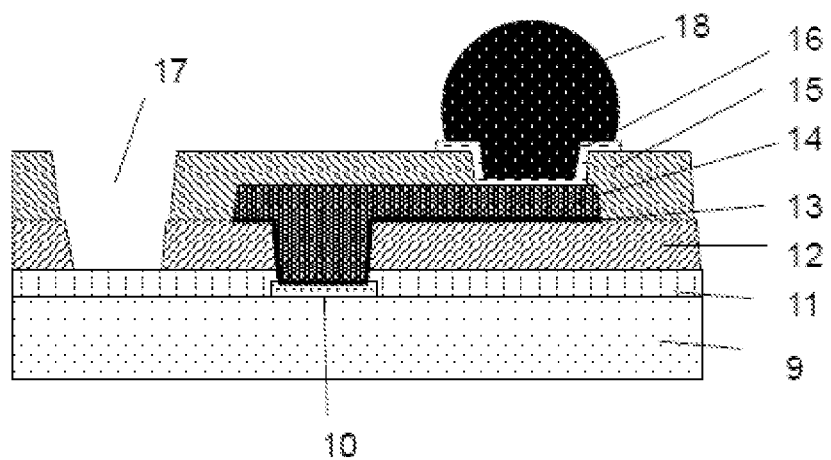
FIG. 2 is an enlarged cross-sectional view of an example of the pad portion of a semiconductor device having a bump.

FIG. 2 depicts an enlarged cross-sectional view of an example of a pad portion of a semiconductor device having a bump. A passivation layer 11 having an Al pad 10 and a viahole for input and output is formed on a silicon wafer 9. Furthermore, an insulation layer 12 is formed on the passivation layer 11, a metal layer 13 composed of Cr, Ti, or the like is further formed so as to be connected with the Al pad 10, and a metal wiring 14 composed of Al, Cu, or the like is formed through electrolytic plating or the like. The pads are insulated from one another by etching the metal layer 13 lying around a solder bump 18. A barrier metal 16 and the solder bump 18 are formed on the insulated pads. A scribe line 17 is formed when an insulation film 15 is processed.

Figure 3:
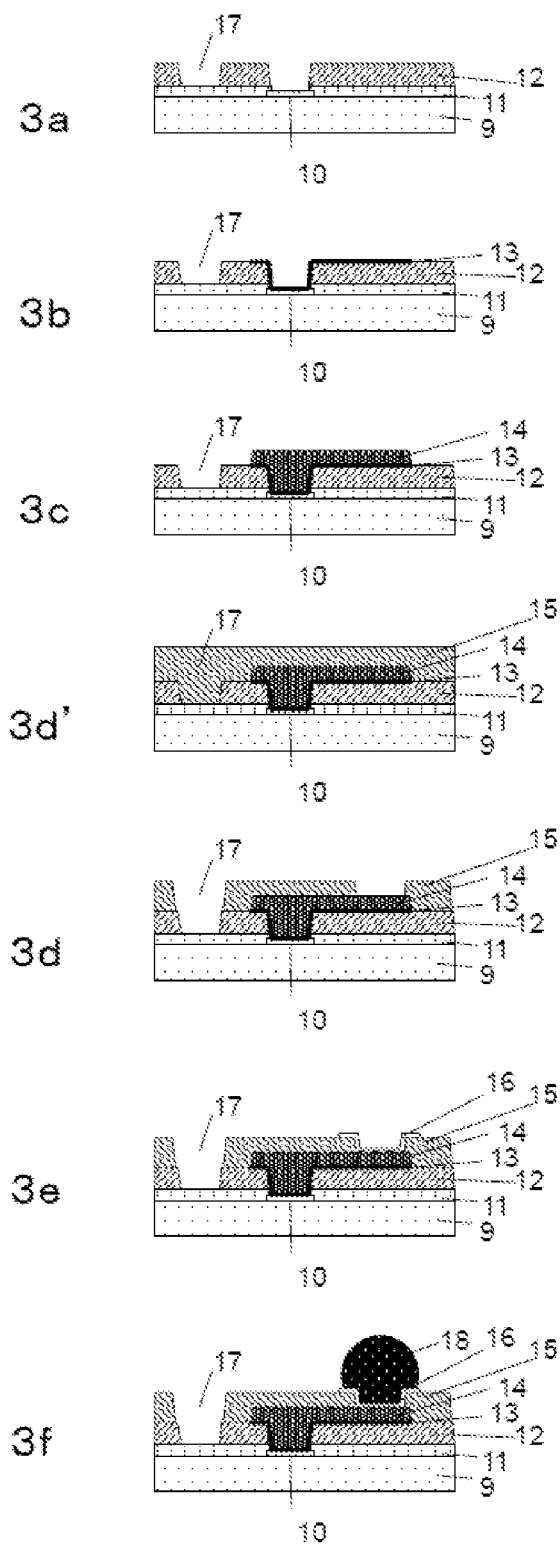
FIG. 3 is a schematic view depicting an example of a method of producing a semiconductor device having a bump.

Next, a method of producing a semiconductor device will be described with reference to the drawings. FIG. 3 depicts an example of a method of producing a semiconductor device having a bump. In the step 3a, a resin composition according to the present invention is applied to a silicon wafer 9 having an Al pad 10 and a passivation layer 11 formed thereon, and undergoes a photolithography step to form an insulation layer 12 having a pattern. Then, in the step 3b, a metal layer 13 is formed using a sputtering method. In the step 3c, a metal wiring 14 is formed in film form on the metal layer 13 using a plating method. Next, in the step 3d', a resin composition according to the present invention is applied, and in the step 3d, the composition undergoes a photolithography step to form a pattern as an insulation layer 15. When this is done, the resin composition as the constituent of the insulation layer 15 is processed into a thick film in a scribe line 17. A wiring (what is called a rewiring) can further be formed on the insulation layer 15. In cases where a multilayered wiring structure having two or more layers is formed, repeating the above-mentioned step makes it possible to form a multilayered wiring structure in which two or more layers of rewiring are separated by an interlayer insulation layer composed of a cured film according to the present invention. The number of layers in the multilayered wiring structure is not limited to any upper limit, and a structure having 10 or less layers is often used. Then, in the step 3e, a barrier metal 16 is formed, and in the step 3f, a solder bump 18 is formed. Then, the resulting piece is cut and divided into chips by dicing along the last scribe line 17, thus making it possible to obtain a semiconductor device having a bump.

EXAMPLES

The present invention will be described below with reference to Examples and the like, but the present invention is not limited to these Examples. Here, the evaluation methods in Examples are as below-mentioned.

(1) Sensitivity

Varnish obtained in each of Examples and Comparative Examples was applied to an 8-inch silicon wafer using a spin coating method and using a coater/developer ACT-8 (manufactured by Tokyo Electron Limited), and baked at 120° C. for three minutes to produce a prebaked film having a film thickness of 3.0 µm. In this regard, the film thickness was measured on conditions at a refractive index of 1.63 using LAMBDA ACE STM-602 manufactured by Dainippon Screen Mfg. Co., Ltd. Then, an exposure machine, i-line Stepper NSR-2005i9C (manufactured by Nikon Corporation), was used to expose the film via a mask with a pattern having a 10-µm contact hole at 5-mJ/cm$^2$ intervals in the exposure energy range of from 50 to 300 mJ/cm$^2$. After the exposure, a development process was carried out using the developer ACT-8 and using an aqueous solution of 2.38 wt % tetramethylammonium (hereinafter referred to as TMAH, manufactured by Tama Chemicals Co., Ltd.) as a developer solution until the amount of film loss became 0.5 µm, and then, the resulting film was rinsed with distilled water and dried by shaking to obtain a pattern.

The obtained pattern was observed using an FDP microscope MX61 (manufactured by Olympus Corporation) at a magnification ratio of 20× to measure the aperture diameter of the contact hole. The lowest exposure energy with which the aperture diameter of the contact hole reached 10 μm was determined, and was regarded as the sensitivity.

(2) Bending Resistance Evaluation

Figure 5:
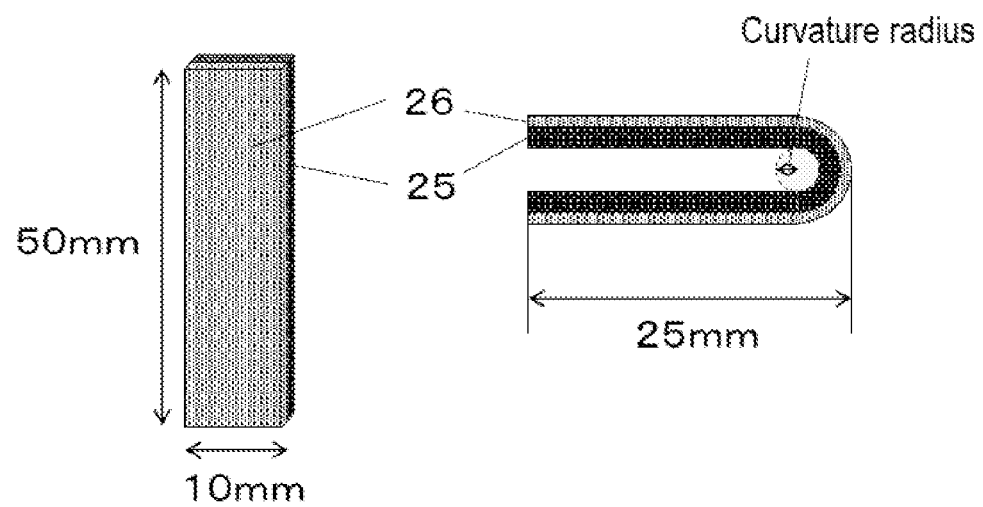
FIG. 5 is a schematic diagram of the bending resistance evaluation in an Example.

As shown in FIG. 5, varnish obtained in each of Examples and Comparative Examples was applied to a polyimide film substrate 25 having a film thickness of 20 μm using a spin coating method at an arbitrary number of rotations to obtain a photosensitive resin film, which was prebaked on a hot plate at 120° C. for two minutes in a drying step to obtain a photosensitive resin film. Next, the film was subjected to shower development with an aqueous solution of 2.38 mass % tetramethylammonium hydroxide using an automatic developer (AD-2000, manufactured by Takizawa Sangyo K.K.) for 90 seconds, and then, rinsed with pure water for 30 seconds. The substrate with the developed photosensitive resin film was heated in an inert oven CLH-21CD-S (manufactured by Koyo Thermo Systems Co., Ltd.) with the temperature raised to 250° C. under heating conditions at 5° C./minute at an oxygen concentration of 20 ppm or less, and further fired at 250° C. for one hour to obtain a cured film 26 having a film thickness of 2.0 μm.

Figure 4:
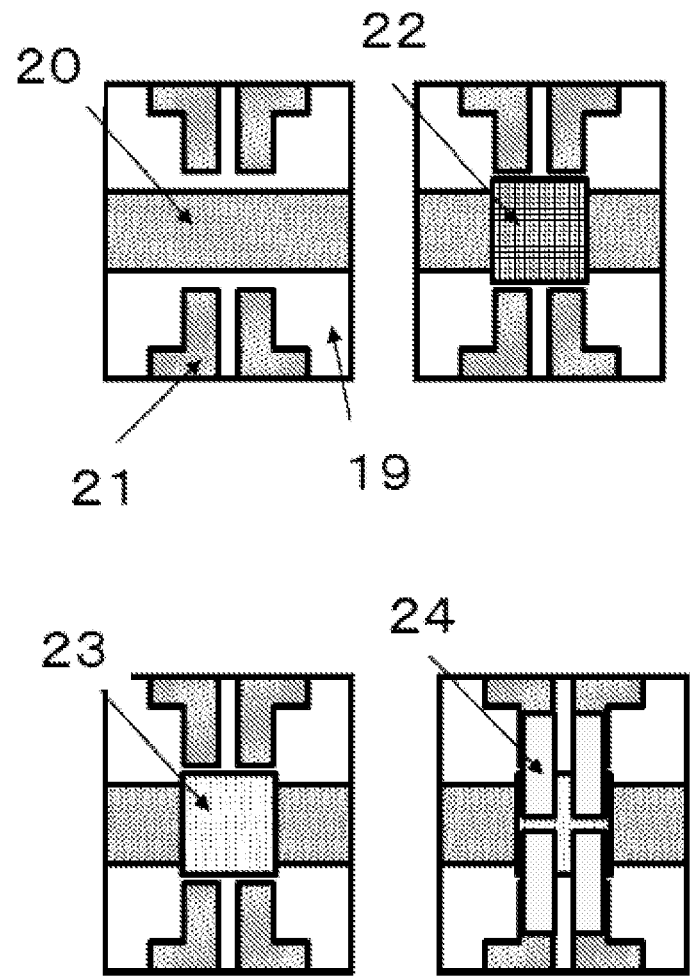
FIG. 4 is a schematic diagram of a procedure for producing an organic EL display device in an Example.

Then, the polyimide film substrate 25 including the cured film was cut into 10 sheets having a size 50 mm long×10 mm wide. Next, the polyimide film substrate 25 was bent at 180° along the line 25 mm away from a longitudinal end with the cured film 26 side facing outward, and held for 30 seconds. After 30 seconds, the bent polyimide film substrate was unbent, and an FPD inspection microscope (MX-61L; manufactured by Olympus Corporation) was used to observe the portion bent along the line 25 mm away from a longitudinal end on the surface of the cured film to evaluate a change in the appearance of the surface of the cured film. The bending test was carried out in the curvature radius range of from 0.1 to 1.0 mm, and a record was taken of the smallest curvature radius which did not cause any appearance change, such as any exfoliation of the cured film from the polyimide film substrate or any cracking in the surface of the cured film. (3) Evaluation of long-term reliability of organic EL display device FIG. 4 depicts a schematic diagram of a procedure for producing an organic EL display device. First, an ITO transparent conductive film, 10 nm, was formed on the whole face of a non-alkali glass substrate 19, 38 mm×46 mm, using a sputtering method, and etched in the form of a first electrode (transparent electrode) 20. In addition, an auxiliary electrode 21 for taking out a second electrode was simultaneously formed. The obtained substrate was washed under ultrasonication for ten minutes using SEMICOCLEAN 56 (which is a tradename and manufactured by Furuuchi Chemical Corporation), and then, washed with ultrapure water. Next, each photosensitive resin composition shown in Table 1 was applied to the whole face of this substrate using a spin coating method, and prebaked on a hot plate at 120° C. for two minutes. This film was subjected to UV exposure via a photomask, then developed with an aqueous solution of 2.38 mass % TMAH to dissolve the unnecessary portions, and rinsed with pure water. The obtained resin pattern was heat-treated under a nitrogen atmosphere at 250° C. in an inert oven CLH-21CD-S (manufactured by Koyo Thermo Systems Co., Ltd.) for one hour. In this manner, openings having a width of 70 μm and a length of 260 1.tm were disposed at a pitch of 155 μm in the width direction and at a pitch of 465 μm in the length direction, and an insulation layer 22 shaped in such a manner that each opening exposed a first electrode was formed only in the effective area of the substrate. In this manner, an insulation layer having an insulation layer opening ratio of 25% was formed in the 16 mm square effective area in the substrate. The insulation layer had a thickness of approximately 1.0 μm Next, nitrogen plasma treatment was carried out as pretreatment, and then, an organic EL layer 23 containing a light-emitting layer was formed using a vacuum vapor deposition method. In this regard, the degree of vacuum was $1 \times 10^{-3}$ Pa or less during vapor deposition, and during the vapor deposition, the substrate was rotated with respect to the source of vapor deposition. First, a compound (HT-1), 10 nm, as a hole injection layer and a compound (HT-2), 50 nm, as a hole transport layer were vapor-deposited. Next, on the light-emitting layer, a compound (GH-1) as a host material and a compound (GD-1) as a dopant material were vapor-deposited to a thickness of 40 nm with the dope concentration adjusted to 10%. Next, as electron transporting materials, a compound (ET-1) and a compound (LiQ) were laminated, at a volume ratio of 1:1, to a thickness of 40 nm. The structures of the compounds used for the organic EL layer are shown below.

[Chem. 7]

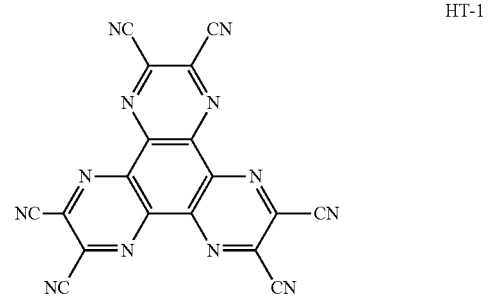

HT-1

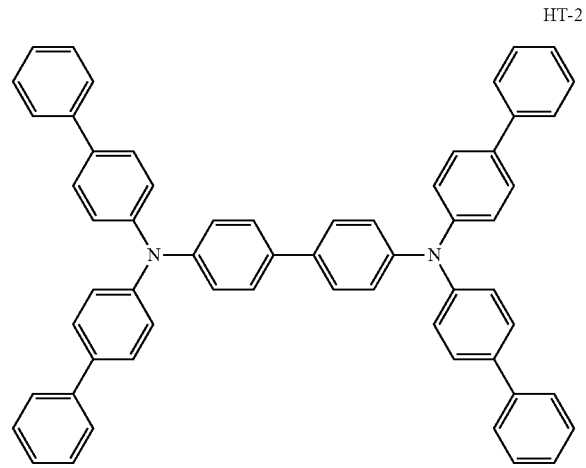

HT-2

GH-1

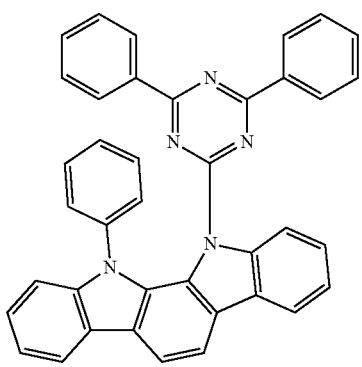

GD-1

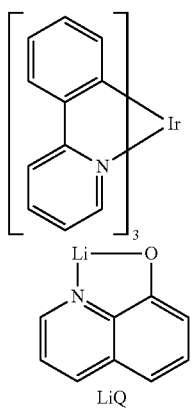

LiQ

ET-1

Next, a compound (LiQ), 2 nm, was vapor-deposited, and Mg and Ag, 10 nm, was vapor-deposited at a volume ratio of 10:1 to form a second electrode (opaque electrode) 24. Lastly, a cap-shaped glass plate was adhered to the resulting piece using an epoxy resin-based adhesive agent under a low-humidity nitrogen atmosphere so that the piece could be encapsulated. Thus, four 5 mm square organic EL display devices of a top emission type were produced on one substrate. In this regard, the film thickness mentioned here refers to a value displayed on a crystal oscillation type of film thickness monitor.

The produced organic EL display device was placed on a hot plate heated to 80° C. with the light-emitting face upward, and irradiated with UV light having a wavelength of 365 nm and an illuminance of 0.6 mW/cm². The organic EL display device was allowed to emit light by driving at a direct current of 0.625 mA immediately (0 hours), 250 hours, 500 hours, and 1000 hours after irradiation, and the ratio of the area of the light-emitting portions to the area of the light-emitting pixels (pixel light-emitting area ratio) was measured. As the pixel light-emitting area ratio determined using this evaluation method after the elapse of 1000 hours, 80% or more can be regarded as representing excellent long-term reliability, and 90% or more is more preferable.

(4) Measurement of Weight-Average Molecular Weight of Phenolic Resin

The weight-average molecular weight (Mw) of a resin obtained in each of Synthesis Examples 8 to 15 and Comparative Synthesis Examples 1 to 2 was measured in terms of polystyrene using a GPC (gel permeation chromatography) device Waters 2690-996 (manufactured by Nihon Waters K.K.) and using N-methyl-2-pyrrolidone (hereinafter referred to as NMP) as a developing solvent.

Synthesis Example 1: Synthesis of Hydroxyl Group-Containing Diamine Compound (α)

In 100 mL of acetone and 17.4 g (0.3 mol) of propylene oxide, 18.3 g (0.05 mol) of 2,2-bis(3-amino-4-hydroxyphenyl)hexafluoropropane (hereinafter referred to as BAHF) was dissolved, and the resulting mixture was cooled to −15° C. In this mixture, a solution of 20.4 g (0.11 mol) of 3-nitrobenzoyl chloride dissolved in 100 mL of acetone was added dropwise. On completion of the dropwise addition, the resulting mixture was allowed to react at −15° C. for four hours, and was restored to room temperature. The precipitated white solid was collected by filtration, and dried in vacuo at 50° C.

Into a 300-mL stainless steel autoclave, 30 g of the solid was added, and dispersed in 250 mL of methylcellosolve, and to the resulting mixture, 2 g of 5% palladium-carbon was added. Into the resulting mixture, hydrogen was introduced from a balloon, and the resulting mixture was allowed to undergo reduction reaction at room temperature. After approximately two hours, no more deflation of the balloon was verified, followed by terminating the reaction. On completion of the reaction, a palladium compound as a catalyst was removed by filtration, and the residue was concentrated with a rotary evaporator to obtain a hydroxyl group-containing diamine compound (α) represented by the following formula.

[Chem. 8]

(α)

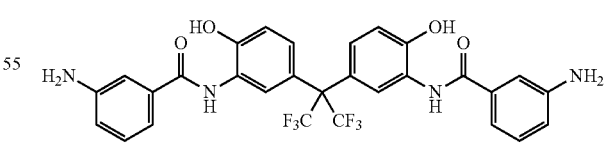

Synthesis Example 2: Synthesis of Quinone Diazide Compound (c-1)

Under a dry nitrogen gas stream, 21.22 g (0.05 mol) of TrisP-PA (which is a tradename and manufactured by Honshu Chemical Industry Co., Ltd.) and 36.27 g (0.135 mol) of 5-naphthoquinone diazide sulfonyl acid chloride were dissolved in 450 g of 1,4-dioxane, and the resulting mixture was brought to room temperature. To the resulting mixture, 15.18 g of triethylamine mixed with 50 g of 1,4-dioxane was added dropwise in such a manner that the inside of the system was not 35° C. or more. After the dropwise addition, the resulting mixture was stirred at 30° C. for two hours. The triethylamine salt was filtered, and the filtrate was poured into water. Then, the precipitated deposit was collected by filtration. This deposit was dried using a vacuum dryer to obtain a quinone diazide compound (c-1) represented by the following formula.

[Chem. 9]

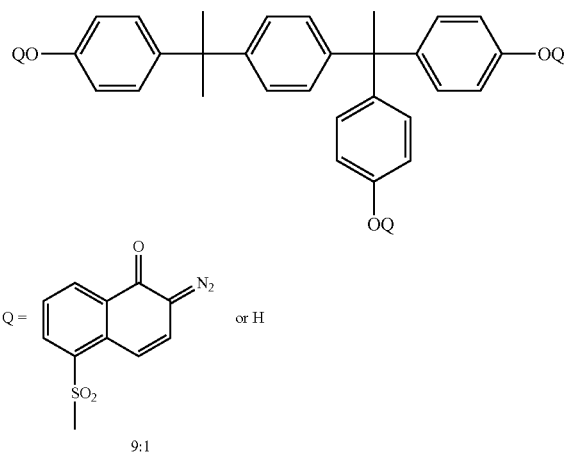

(c-1)

Synthesis Example 3: Synthesis of Quinone Diazide Compound (c-2)

Under a dry nitrogen gas stream, 21.22 g (0.05 mol) of TrisP-PA (which is a tradename and manufactured by Honshu Chemical Industry Co., Ltd.) and 36.27 g (0.135 mol) of 4-naphthoquinone diazide sulfonyl acid chloride were dissolved in 450 g of 1,4-dioxane, and the resulting mixture was brought to room temperature. To the resulting mixture, 15.18 g of triethylamine mixed with 50 g of 1,4-dioxane was added dropwise in such a manner that the inside of the system was not 35° C. or more. After the dropwise addition, the resulting mixture was stirred at 30° C. for two hours. The triethylamine salt was filtered, and the filtrate was poured into water. Then, the precipitated deposit was collected by filtration. This deposit was dried using a vacuum dryer to obtain a quinone diazide compound (c-2) represented by the following formula.

[Chem.10]

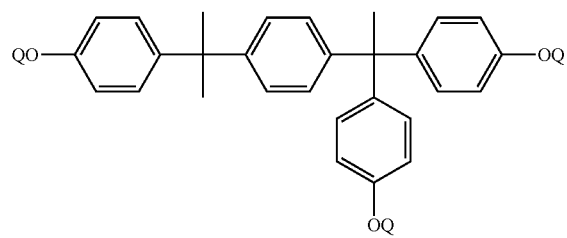

(c-2)

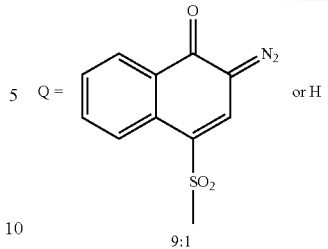

Synthesis Example 4: Synthesis of Alkali-Soluble Resin (a-1)

Under a dry nitrogen gas stream, 31.0 g (0.10 mol) of 3,3',4,4'-diphenyl ether tetracarboxylic dianhydride (hereinafter referred to as ODPA) was dissolved in 500 g of NMP. To the resulting mixture, 45.35 g (0.075 mol) of the hydroxyl group-containing diamine compound (a) obtained in Synthesis Example 1 and 1.24 g (0.005 mol) of 1,3-bis (3-aminopropyl)tetramethyl disiloxane (hereinafter referred to as SiDA) were added together with 50 g of NMP, and the resulting mixture was allowed to react at 40° C. for two hours. Next, 4.36 g (0.04 mol) of 3-aminophenol (hereinafter referred to as MAP) as an end-capping agent was added together with 5 g of NMP, and the resulting mixture was allowed to react at 50° C. for two hours. Then, a solution of 32.39 g (0.22 mol) of N,N-dimethylformamidediethylacetal diluted with 50 g of NMP was added dropwise over ten minutes. After the dropwise addition, the resulting mixture was stirred at 50° C. for three hours. On completion of the stirring, the resulting solution was cooled to room temperature, and then, the solution was added to 3 L of water to obtain a white deposit. This deposit was collected by filtration, washed with water three times, and dried in a vacuum dryer at 80° C. for 24 hours to obtain a polyimide precursor (a-1) which was an alkali-soluble resin.

Synthesis Example 5: Synthesis of Alkali-Soluble Resin (a-2)

Under a dry nitrogen gas stream, 29.3 g (0.08 mol) of BAHF, 1.24 g (0.005 mol) of SiDA, and 3.27 g (0.03 mol) of MAP as an end-capping agent were dissolved in 150 g of NMP. To the resulting mixture, 31.0 g (0.1 mol) of 3,3',4, 4'-diphenyl ether tetracarboxylic dianhydride (hereinafter referred to as ODPA) was added together with 50 g of NMP, and the resulting mixture was stirred at 20° C. for one hour, and then stirred at 50° C. for four hours. Then, 15 g of xylene was added, and the resulting mixture was stirred at 150° C. for five hours with water under azeotropy together with xylene. On completion of the stirring, the resulting solution was added to 3 L of water to collect a white deposit. This deposit was collected by filtration, washed with water three times, and dried in a vacuum dryer at 80° C. for 24 hours to obtain a polyimide (a-2) which was an alkali-soluble resin.

Synthesis Example 6: Synthesis of Alkali-Soluble Resin (a-3)

Under a dry nitrogen gas stream, 18.3 g (0.05 mol) of BAHF was dissolved in 50 g of NMP and 26.4 g (0.3 mol) of glycidyl methyl ether, and the resulting solution was cooled to a temperature of −15° C. In the resulting solution, a solution of 7.4 g (0.025 mol) of diphenyletherdicarboxylic dichloride (manufactured by Nihon Nohyaku Co., Ltd.) and 5.1 g (0.025 mol) of isophthalic chloride (manufactured by Tokyo Chemical Industry Co., Ltd.) dissolved in 25 g of γ-butyrolactone (GBL) was added dropwise in such a manner that the temperature of the inside did not exceed 0° C. On completion of the dropwise addition, the resulting mixture continued to be stirred at −15° C. for six hours. On completion of the reaction, the solution was added to 3 L of water containing 10 wt % methanol to collect a white deposit. This deposit was collected by filtration, washed with water three times, and dried in a vacuum dryer at 80° C. for 24 hours to obtain a polybenzoxazole precursor (a-3) which was an alkali-soluble resin.

Synthesis Example 7: Synthesis of Alkali-Soluble Resin (a-4)

Into a 500-ml flask, 5 g of 2,2'-azobis(isobutylonitrile), 5 g of t-dodecanethiol, and 150 g of propylene glycol monomethyl ether acetate (hereinafter referred to as PGMEA for short) were added. Then, 30 g of methacrylic acid, 35 g of benzyl methacrylate, and 35 g of tricyclo[5.2.1.0$^{2,6}$]decane-8-yl methacrylate were added, the resulting mixture was stirred at room temperature for a while, the flask was purged with nitrogen, and the mixture was stirred under heating at 70° C. for five hours. Next, to the obtained solution, 15 g of glycidyl methacrylate, 1 g of dimethylbenzyl amine, and 0.2 g of p-methoxy phenol were added, and the resulting mixture was stirred under heating at 90° C. for four hours to obtain a solution of an acryl resin (a-4) which was an alkali-soluble resin. The obtained acryl resin solution had a solid content of 43 wt %.

Synthesis Example 8: Synthesis of Phenolic Resin (b-1) Having Halogen Atom

Under a dry nitrogen gas stream, 672 g (2.0 mol) of bisphenol AF and 96 g (1.6 mol) of an aqueous solution of 50 wt % formaldehyde were dissolved in 250 g of methylisobutyl ketone. To the resulting mixture, 2.5 g of p-toluenesulfonic acid was added while the resulting mixture was cooled to 30° C. or less, and then, the resulting mixture was stirred at 100° C. for four hours. On completion of the stirring, 5.3 g of an aqueous solution of 10% NaOH was added to neutralize the mixture, and then, the resulting solution was washed with 750 g of pure water to remove the neutralized salt. Then, the solution was heated to 160° C. in two hours while concentrated, and dried under reduced pressure at 160° C. at 100 mmHg for 30 minutes to obtain a bisphenol AF novolac resin (b-1). The weight-average molecular weight of (b-1) was 1300.

Synthesis Example 9: Synthesis of Phenolic Resin (b-2) Having Halogen Atom

A bisphenol AF/cresol novolac resin (b-2) was obtained in the same manner as in Synthesis Example 8 except that 537 g (1.6 mol) of bisphenol AF and 43 g (0.4 mol) of m-cresol were used in place of 672 g (2.0 mol) of bisphenol AF. The weight-average molecular weight of (b-2) was 1200.

Synthesis Example 10: Synthesis of Phenolic Resin (b-3) Having Halogen Atom

A bisphenol AF/cresol novolac resin (b-3) was obtained in the same manner as in Synthesis Example 8 except that 336 g (1.0 mol) of bisphenol AF and 108 g (1.0 mol) of m-cresol were used in place of 672 g (2.0 mol) of bisphenol AF. The weight-average molecular weight of (b-3) was 1100.

Synthesis Example 11: Synthesis of Phenolic Resin (b-4) Having Halogen Atom

A bisphenol AF/cresol novolac resin (b-4) was obtained in the same manner as in Synthesis Example 8 except that 134 g (0.4 mol) of bisphenol AF and 173 g (1.6 mol) of m-cresol were used in place of 672 g (2.0 mol) of bisphenol AF. The weight-average molecular weight of (b-4) was 1000.

Synthesis Example 12: Synthesis of Phenolic Resin (b-5) Having Halogen Atom

A bisphenol AF novolac resin (b-5) was obtained in the same manner as in Synthesis Example 8 except that 170 g (1.6 mol) of benzaldehyde was used in place of 96 g (1.6 mol) of an aqueous solution of 50 wt % formaldehyde. The weight-average molecular weight of (b-5) was 1400.

Synthesis Example 13: Synthesis of Phenolic Resin (b-6) Having Halogen Atom

In a four-necked flask equipped with a stirrer, a cooling tube, a dropping funnel, and a thermometer, 672 g (2.0 mol) of bisphenol AF and 240 g (4.0 mol) of an aqueous solution of 50 wt % formaldehyde were dissolved in 250 g of methylisobutyl ketone. To the resulting mixture, 6.4 g of trimethylamine was added while the mixture was cooled to 30° C. or less. Then, the resulting mixture was stirred at 100° C. for two hours. On completion of the stirring, 4 parts of oxalic acid was added, and the resulting mixture was dried under reduced pressure at 100° C. at 400 mmHg for two hours to obtain a bisphenol AF resole resin (b-6). The weight-average molecular weight of (b-6) was 900.

Synthesis Example 14: Synthesis of Phenolic Resin (b-8) Having Halogen Atom

A bisphenol AF/bisphenol S novolac resin (b-8) was obtained in the same manner as in Synthesis Example 8 except that 537 g (1.6 mol) of bisphenol AF and 100 g (0.4 mol) of bisphenol S were used in place of 672 g (2.0 mol) of bisphenol AF. The weight-average molecular weight of (b-8) was 1300.

Synthesis Example 15: Synthesis of Phenolic Resin (b-9) Having Halogen Atom

A bisphenol AF/bisphenol A novolac resin (b-9) was obtained in the same manner as in Synthesis Example 8 except that 537 g (1.6 mol) of bisphenol AF and 91 g (0.4 mol) of bisphenol A were used in place of 672 g (2.0 mol) of bisphenol AF. The weight-average molecular weight of (b-9) was 1200.

Comparative Synthesis Example 1: Synthesis of Phenolic Resin (b'-1) Having No Halogen Atom Under a dry nitrogen gas stream, 456 g (2.0 mol) of bisphenol A, 84 g (1.4 mol) of an aqueous solution of 50 wt % formaldehyde, and 250 g of methylisobutyl ketone were mixed. To the resulting mixture, 4.6 g of oxalic acid was added while the resulting mixture was cooled to 30° C. or less, and then, the resulting mixture was stirred at 100° C. for four hours. On completion of the stirring, the solution was heated to 160° C. for two hours while concentrated, and dried under reduced pressure at 160° C. at 100 mmHg for 30 minutes to obtain a bisphenol A novolac resin (b'-1). The weight-average molecular weight of (b'-1) was 900.

Comparative Synthesis Example 2: Synthesis of Phenolic Resin (b'-2) Having No Halogen Atom Under a dry nitrogen gas stream, 70.2 g (0.65 mol) of m-cresol, 37.8 g (0.35 mol) of p-cresol, 56 g (0.93 mol) of an aqueous solution of 50 wt % formaldehyde, 0.63 g (0.005 mol) of oxalic dihydrate, and 260 g of methylisobutyl ketone were well mixed in a 500-ml flask, and then, the flask was immersed in an oil bath. Then, the reaction solution was allowed to undergo polycondensation reaction under reflux for seven hours. Then, the temperature of the oil bath was reduced to room temperature over three hours, the pressure in the flask was then reduced to 40 to 67 hPa to remove the volatile, the dissolved resin was cooled to room temperature, and to the resulting solution, GBL was added to obtain a solution of a cresol novolac resin (b'-2) which was an alkali-soluble resin having a solid content adjusted to 50 wt %. The weight-average molecular weight of (b'-2) was 7000.

The structural formulae of the bisphenol AF, bisphenol A, and HMOM-TPHAP used in each of Synthesis Examples, Comparative Synthesis Examples, Examples, and Comparative Examples are shown below.

[Chem. 11]

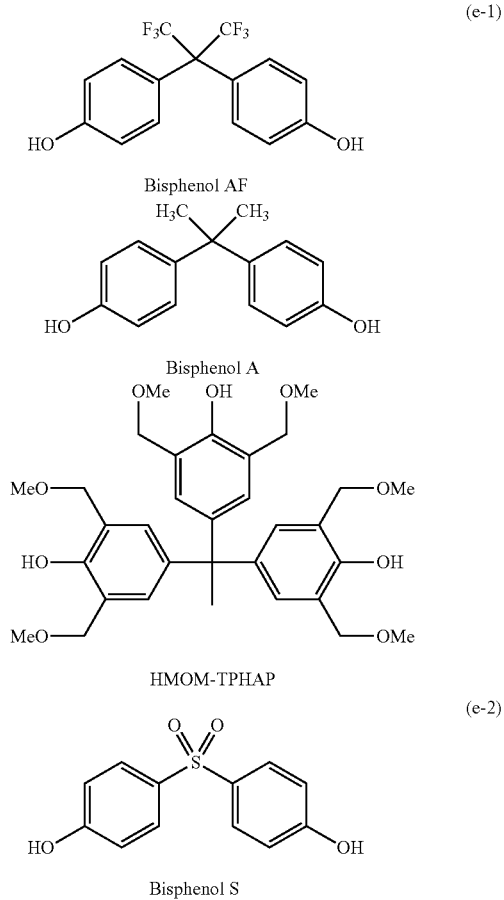

Example 1

A varnish of a positive-working photosensitive resin composition was obtained by adding 8.0 g of the alkali-soluble resin (a-1), 2.0 g of the phenolic resin (b-1), and 2.0 g of the quinone diazide compound (c-1) to 30 g of GBL. The obtained varnish was used to evaluate the sensitivity, the bending resistance, and the long-term reliability of the organic EL display device as above-mentioned.

Example 2

A varnish of a positive-working photosensitive resin composition was obtained in the same manner as in Example 1 except that 2.0 g of the phenolic resin (b-2) was used in place of 2.0 g of the phenolic resin (b-1). The obtained varnish was used to evaluate the sensitivity, the bending resistance, and the long-term reliability of the organic EL display device as above-mentioned.

Example 3

A varnish of a positive-working photosensitive resin composition was obtained in the same manner as in Example 1 except that 2.0 g of the phenolic resin (b-3) was used in place of 2.0 g of the phenolic resin (b-1). The obtained varnish was used to evaluate the sensitivity, the bending resistance, and the long-term reliability of the organic EL display device as above-mentioned.

Example 4

A varnish of a positive-working photosensitive resin composition was obtained in the same manner as in Example 1 except that 2.0 g of the phenolic resin (b-4) was used in place of 2.0 g of the phenolic resin (b-1). The obtained varnish was used to evaluate the sensitivity, the bending resistance, and the long-term reliability of the organic EL display device as above-mentioned.

Example 5

A varnish of a positive-working photosensitive resin composition was obtained in the same manner as in Example 1 except that 2.0 g of the phenolic resin (b-5) was used in place of 2.0 g of the phenolic resin (b-1). The obtained varnish was used to evaluate the sensitivity, the bending resistance, and the long-term reliability of the organic EL display device as above-mentioned.

Example 6

A varnish of a positive-working photosensitive resin composition was obtained in the same manner as in Example 1 except that 2.0 g of the phenolic resin (b-6) was used in place of 2.0 g of the phenolic resin (b-1). The obtained varnish was used to evaluate the sensitivity, the bending resistance, and the long-term reliability of the organic EL display device as above-mentioned.

Example 7

A varnish of a positive-working photosensitive resin composition was obtained in the same manner as in Example 1 except that 9.5 g of the alkali-soluble resin (a-1) and 0.5 g of the phenolic resin (b-1) were used in place of 8.0 g of the alkali-soluble resin (a-1) and 2.0 g of the phenolic resin (b-1). The obtained varnish was used to evaluate the sensitivity, the bending resistance, and the long-term reliability of the organic EL display device as above-mentioned.

Example 8

A varnish of a positive-working photosensitive resin composition was obtained in the same manner as in Example 1 except that 9.0 g of the alkali-soluble resin (a-1) and 1.0 g of the phenolic resin (b-1) were used in place of 8.0 g of the alkali-soluble resin (a-1) and 2.0 g of the phenolic resin (b-1). The obtained varnish was used to evaluate the sensitivity, the bending resistance, and the long-term reliability of the organic EL display device as above-mentioned.

Example 9

A varnish of a positive-working photosensitive resin composition was obtained in the same manner as in Example 1 except that 5.0 g of the alkali-soluble resin (a-1) and 5.0 g of the phenolic resin (b-1) were used in place of 8.0 g of the alkali-soluble resin (a-1) and 2.0 g of the phenolic resin (b-1). The obtained varnish was used to evaluate the sensitivity, the bending resistance, and the long-term reliability of the organic EL display device as above-mentioned.

Example 10

A varnish of a positive-working photosensitive resin composition was obtained in the same manner as in Example 1 except that 3.0 g of the alkali-soluble resin (a-1) and 7.0 g of the phenolic resin (b-1) were used in place of 8.0 g of the alkali-soluble resin (a-1) and 2.0 g of the phenolic resin (b-1). The obtained varnish was used to evaluate the sensitivity, the bending resistance, and the long-term reliability of the organic EL display device as above-mentioned.

Example 11

A varnish of a positive-working photosensitive resin composition was obtained in the same manner as in Example 1 except that 2.0 g of the quinone diazide compound (c-2) was used in place of 2.0 g of the quinone diazide compound (c-1). The obtained varnish was used to evaluate the sensitivity, the bending resistance, and the long-term reliability of the organic EL display device as above-mentioned.

Example 12

A varnish of a positive-working photosensitive resin composition was obtained in the same manner as in Example 1 except that 2.0 g of the quinone diazide compound (c-1) was changed to 4.0 g of the same compound. The obtained varnish was used to evaluate the sensitivity, the bending resistance, and the long-term reliability of the organic EL display device as above-mentioned.

Example 13

A varnish of a positive-working photosensitive resin composition was obtained in the same manner as in Example 11 except that 2.0 g of the quinone diazide compound (c-2) was changed to 4.0 g of the same compound. The obtained varnish was used to evaluate the sensitivity, the bending resistance, and the long-term reliability of the organic EL display device as above-mentioned.

Example 14

A varnish of a positive-working photosensitive resin composition was obtained in the same manner as in Example 1 except that 8.0 g of the alkali-soluble resin (a-2) was used in place of 8.0 g of the alkali-soluble resin (a-1). The obtained varnish was used to evaluate the sensitivity, the bending resistance, and the long-term reliability of the organic EL display device as above-mentioned.

Example 15

A varnish of a positive-working photosensitive resin composition was obtained in the same manner as in Example 1 except that 8.0 g of the alkali-soluble resin (a-3) was used in place of 8.0 g of the alkali-soluble resin (a-1). The obtained varnish was used to evaluate the sensitivity, the bending resistance, and the long-term reliability of the organic EL display device as above-mentioned.

Example 16

A varnish of a positive-working photosensitive resin composition was obtained in the same manner as in Example 1 except that 18.6 g of a solution of the alkali-soluble resin (a-4) (the resin solid content: 8.0 g) was used in place of 8.0 g of the alkali-soluble resin (a-1). The obtained varnish was used to evaluate the sensitivity, the bending resistance, and the long-term reliability of the organic EL display device as above-mentioned.

Example 17

A varnish of a positive-working photosensitive resin composition was obtained in the same manner as in Example 1 except that 2.0 g of the thermal crosslinking agent (d-1) was added. The obtained varnish was used to evaluate the sensitivity, the bending resistance, and the long-term reliability of the organic EL display device as above-mentioned.

Example 18

A varnish of a positive-working photosensitive resin composition was obtained in the same manner as in Example 1 except that 2.0 g of WPAG-336 (a tradename and manufactured by Fujifilm Wako Pure Chemical Corporation) was used in place of 2.0 g of the quinone diazide compound (c-1). The obtained varnish was used to evaluate the sensitivity, the bending resistance, and the long-term reliability of the organic EL display device as above-mentioned.

Example 19

A varnish of a positive-working photosensitive resin composition was obtained in the same manner as in Example 1 except that 1.0 g of the phenolic compound (e-1) having an electron-withdrawing group and a phenolic hydroxyl group and having a molecular weight of 100 or more and less than 500 was added. The obtained varnish was used to evaluate the sensitivity, the bending resistance, and the long-term reliability of the organic EL display device as above-mentioned.

Example 20

A varnish of a positive-working photosensitive resin composition was obtained in the same manner as in Example 1 except that 1.0 g of the phenolic compound (e-2) having an electron-withdrawing group and a phenolic hydroxyl group and having a molecular weight of 100 or more and less than 500 was added. The obtained varnish was used to evaluate the sensitivity, the bending resistance, and the long-term reliability of the organic EL display device as above-mentioned.

Example 21

A varnish of a positive-working photosensitive resin composition was obtained in the same manner as in Example 1 except that 2.0 g of the phenolic resin (b-8) was used in place of 2.0 g of the phenolic resin (b-1). The obtained varnish was used to evaluate the sensitivity, the bending resistance, and the long-term reliability of the organic EL display device as above-mentioned.

Example 22

A varnish of a positive-working photosensitive resin composition was obtained in the same manner as in Example 1 except that 2.0 g of the phenolic resin (b-9) was used in place of 2.0 g of the phenolic resin (b-1). The obtained varnish was used to evaluate the sensitivity, the bending resistance, and the long-term reliability of the organic EL display device as above-mentioned.

Comparative Example 1

A varnish of a positive-working photosensitive resin composition was obtained by adding 10.0 g of the alkali-soluble resin (a-1) and 2.0 g of the quinone diazide compound (c-1) to 30 g of GBL. The obtained varnish was used to evaluate the sensitivity, the bending resistance, and the long-term reliability of the organic EL display device as above-mentioned.

Comparative Example 2

A varnish of a positive-working photosensitive resin composition was obtained in the same manner as in Comparative Example 1 except that 8.0 g of the alkali-soluble resin (a-1) and 2.0 g of the phenolic resin (b'-1) were used in place of 10.0 g of the alkali-soluble resin (a-1). The obtained varnish was used to evaluate the sensitivity, the bending resistance, and the long-term reliability of the organic EL display device as above-mentioned.

Comparative Example 3

A varnish of a positive-working photosensitive resin composition was obtained in the same manner as in Comparative Example 1 except that 8.0 g of the alkali-soluble resin (a-1) and 2.0 g of the phenolic resin (b'-2) were used in place of 10.0 g of the alkali-soluble resin (a-1). The obtained varnish was used to evaluate the sensitivity, the bending resistance, and the long-term reliability of the organic EL display device as above-mentioned.

Comparative Example 4

A varnish of a positive-working photosensitive resin composition was obtained in the same manner as in Comparative Example 1 except that 2.0 g of the quinone diazide compound (c-2) was used in place of 2.0 g of the quinone diazide compound (c-1). The obtained varnish was used to evaluate the sensitivity, the bending resistance, and the long-term reliability of the organic EL display device as above-mentioned.

Comparative Example 5

A varnish of a positive-working photosensitive resin composition was obtained in the same manner as in Comparative Example 1 except that 2.0 g of the quinone diazide compound (c-1) was changed to 4.0 g of the same compound. The obtained varnish was used to evaluate the sensitivity, the bending resistance, and the long-term reliability of the organic EL display device as above-mentioned.

Comparative Example 6

A varnish of a positive-working photosensitive resin composition was obtained in the same manner as in Comparative Example 4 except that 2.0 g of the quinone diazide compound (c-2) was changed to 4.0 g of the same compound. The obtained varnish was used to evaluate the sensitivity, the bending resistance, and the long-term reliability of the organic EL display device as above-mentioned.

Comparative Example 7

A varnish of a positive-working photosensitive resin composition was obtained in the same manner as in Comparative Example 1 except that 2.0 g of WPAG-336 (a tradename and manufactured by Fujifilm Wako Pure Chemical Corporation) was used in place of 2.0 g of the quinone diazide compound (c-1). The obtained varnish was used to evaluate the sensitivity, the bending resistance, and the long-term reliability of the organic EL display device as above-mentioned.

The compositions and evaluation results in Examples and Comparative Examples are shown in Tables 1 to 2.

TABLE 1

| | Alkali-soluble Resin (a) | Phenolic Resin (b) | | | | Photosensitive Compound (c) | Others | Solvent |
|---|---|---|---|---|---|---|---|---|
| | (Type) (Blended Amount) | (Type) (Blended Amount) | Phenol | Resin Type | Molar Ratio (%) of Formulae (1) and (2) in (b) | (Type) (Blended Amount) | (Type) (Blended Amount) | (Type) (Blended Amount) |
| Example 1 | a-1 8.0 g | b-1 2.0 g | Bisphenol AF | Novolac | 100 | c-1 2.0 g | — | GBL 30 g |
| Example 2 | a-1 8.0 g | b-2 2.0 g | Bisphenol AF Cresol | Novolac | 80 | c-1 2.0 g | — | GBL 30 g |
| Example 3 | a-1 8.0 g | b-3 2.0 g | Bisphenol AF Cresol | Novolac | 50 | c-1 2.0 g | — | GBL 30 g |
| Example 4 | a-1 8.0 g | b-4 2.0 g | Bisphenol AF Cresol | Novolac | 20 | c-1 2.0 g | — | GBL 30 g |

TABLE 1-continued

| | Alkali-soluble Resin (a) (Type) (Blended Amount) | Phenolic Resin (b) (Type) (Blended Amount) | Phenol | Resin Type | Molar Ratio (%) of Formulae (1) and (2) in (b) | Photosensitive Compound (c) (Type) (Blended Amount) | Others (Type) (Blended Amount) | Solvent (Type) (Blended Amount) |
|---|---|---|---|---|---|---|---|---|
| Example 5 | a-1 8.0 g | b-5 2.0 g | Bisphenol AF | Novolac | 100 | c-1 2.0 g | — | GBL 30 g |
| Example 6 | a-1 8.0 g | b-6 2.0 g | Bisphenol AF | Resole | 100 | c-1 2.0 g | — | GBL 30 g |
| Example 7 | a-1 9.5 g | b-1 0.5 g | Bisphenol AF | Novolac | 100 | c-1 2.0 g | — | GBL 30 g |
| Example 8 | a-1 9.0 g | b-1 1.0 g | Bisphenol AF | Novolac | 100 | c-1 2.0 g | — | GBL 30 g |
| Example 9 | a-1 5.0 g | b-1 5.0 g | Bisphenol AF | Novolac | 100 | c-1 2.0 g | — | GBL 30 g |
| Example 10 | a-1 3.0 g | b-1 7.0 g | Bisphenol AF | Novolac | 100 | c-1 2.0 g | — | GBL 30 g |
| Example 11 | a-1 8.0 g | b-1 2.0 g | Bisphenol AF | Novolac | 100 | c-2 2.0 g | — | GBL 30 g |
| Example 12 | a-1 8.0 g | b-1 2.0 g | Bisphenol AF | Novolac | 100 | c-1 4.0 g | — | GBL 30 g |
| Example 13 | a-1 8.0 g | b-1 2.0 g | Bisphenol AF | Novolac | 100 | c-2 4.0 g | — | GBL 30 g |
| Example 14 | a-2 8.0 g | b-1 2.0 g | Bisphenol AF | Novolac | 100 | c-1 2.0 g | — | GBL 30 g |
| Example 15 | a-3 8.0 g | b-1 2.0 g | Bisphenol AF | Novolac | 100 | c-1 2.0 g | — | GBL 30 g |
| Example 16 | a-4 8.0 g | b-1 2.0 g | Bisphenol AF | Novolac | 100 | c-1 2.0 g | — | GBL 30 g |
| Example 17 | a-1 8.0 g | b-1 2.0 g | Bisphenol AF | Novolac | 100 | c-1 2.0 g | HMOM-TPHAP 2.0 g | GBL 30 g |
| Example 18 | a-1 8.0 g | b-1 2.0 g | Bisphenol AF | Novolac | 100 | WPA G-336 2.0 g | — | GBL 30 g |
| Example 19 | a-1 8.0 g | b-1 2.0 g | Bisphenol AF | Novolac | 100 | c-1 2.0 g | e-1 1.0 g | GBL 30 g |
| Example 20 | a-1 8.0 g | b-1 2.0 g | Bisphenol AF | Novolac | 100 | c-1 2.0 g | e-2 1.0 g | GBL 30 g |
| Example 21 | a-1 8.0 g | b-8 2.0 g | Bisphenol AF Bisphenol S | Novolac | 80 | c-1 2.0 g | — | GBL 30 g |
| Example 22 | a-1 8.0 g | b-9 2.0 g | Bisphenol AF Bisphenol A | Novolac | 80 | c-1 2.0 g | — | GBL 30 g |
| Comparative Example 1 | a-1 10.0 g | — | — | — | 0 | c-1 2.0 g | — | GBL 30 g |
| Comparative Example 2 | a-1 8.0 g | b'-1 2.0 g | Bisphenol A | Novolac | 0 | c-1 2.0 g | — | GBL 30 g |
| Comparative Example 3 | a-1 8.0 g | b'-2 2.0 g | Cresol | Novolac | 0 | c-1 2.0 g | — | GBL 30 g |
| Comparative Example 4 | a-1 10.0 g | — | — | — | 0 | c-2 2.0 g | — | GBL 30 g |
| Comparative Example 5 | a-1 10.0 g | — | — | — | 0 | c-1 4.0 g | — | GBL 30 g |
| Comparative Example 6 | a-1 10.0 g | — | — | — | 0 | c-2 4.0 g | — | GBL 30 g |
| Comparative Example 7 | a-1 10.0 g | — | — | — | 0 | WPA G-336 2.0 g | — | GBL 30 g |

TABLE 2

| | Sensitivity (mJ/cm²) | Bending Resistance (mm) | Long-term Reliability Pixel Light-emitting Area Ratio [%] | | | |
|---|---|---|---|---|---|---|
| | | | 0 hr | 250 hr | 500 hr | 1000 hr |
| Example 1 | 140 | 0.2 | 100 | 100 | 98 | 96 |
| Example 2 | 140 | 0.2 | 100 | 98 | 94 | 90 |
| Example 3 | 130 | 0.3 | 100 | 96 | 92 | 86 |
| Example 4 | 120 | 0.4 | 100 | 94 | 88 | 80 |
| Example 5 | 140 | 0.2 | 100 | 100 | 98 | 96 |
| Example 6 | 140 | 0.1 | 100 | 100 | 98 | 96 |
| Example 7 | 160 | 0.2 | 100 | 96 | 92 | 84 |
| Example 8 | 150 | 0.2 | 100 | 98 | 94 | 90 |
| Example 9 | 130 | 0.3 | 100 | 100 | 98 | 96 |
| Example 10 | 120 | 0.5 | 100 | 100 | 98 | 96 |
| Example 11 | 130 | 0.2 | 100 | 100 | 98 | 96 |
| Example 12 | 130 | 0.2 | 100 | 100 | 98 | 96 |
| Example 13 | 120 | 0.2 | 100 | 100 | 98 | 96 |
| Example 14 | 170 | 0.2 | 100 | 100 | 98 | 96 |
| Example 15 | 145 | 0.2 | 100 | 100 | 98 | 96 |
| Example 16 | 130 | 0.2 | 100 | 92 | 84 | 70 |
| Example 17 | 140 | 0.1 | 100 | 100 | 98 | 96 |
| Example 18 | 180 | 0.2 | 100 | 96 | 88 | 80 |
| Example 19 | 130 | 0.3 | 100 | 100 | 100 | 98 |
| Example 20 | 130 | 0.3 | 100 | 100 | 100 | 98 |

TABLE 2-continued

| | Sensitivity (mJ/cm$^2$) | Bending Resistance (mm) | Long-term Reliability Pixel Light-emitting Area Ratio [%] | | | |
|---|---|---|---|---|---|---|
| | | | 0 hr | 250 hr | 500 hr | 1000 hr |
| Example 21 | 140 | 0.2 | 100 | 100 | 98 | 96 |
| Example 22 | 140 | 0.2 | 100 | 98 | 96 | 92 |
| Comparative Example 1 | 170 | 0.2 | 100 | 96 | 90 | 80 |
| Comparative Example 2 | 140 | 0.2 | 100 | 96 | 88 | 78 |
| Comparative Example 3 | 120 | 0.5 | 100 | 94 | 84 | 70 |
| Comparative Example 4 | 150 | 0.2 | 100 | 94 | 88 | 74 |
| Comparative Example 5 | 150 | 0.2 | 100 | 94 | 86 | 72 |
| Comparative Example 6 | 135 | 0.2 | 100 | 92 | 82 | 66 |
| Comparative Example 7 | 200 | 0.2 | 100 | 94 | 86 | 70 |

REFERENCE SIGNS LIST

1: TFT (thin film transistor)
2: Wiring
3: TFT insulation layer
4: Planarization layer
5: ITO (transparent electrode)
6: Substrate
7: Contact hole
8: Insulation layer
9: Silicon wafer
10: Al pad
11: Passivation layer
12: Insulation layer
13: Metal (Cr, Ti, or the like) layer
14: Metal wiring (Al, Cu, or the like)
15: Insulation layer
16: Barrier metal
17: Scribe line
18: Solder bump
19: Non-alkali glass substrate
20: First electrode (transparent electrode)
21: Auxiliary electrode
22: Insulation layer
23: Organic EL layer
24: Second electrode (opaque electrode)
25: Polyimide film substrate
26: Cured film

The invention claimed is:

1. A photosensitive resin composition comprising an alkali-soluble resin (a), a phenolic resin (b) having a halogen atom, and a photosensitive compound (c), wherein said phenolic resin (b) having a halogen atom has structural units represented by formula (1) and/or formula (2):

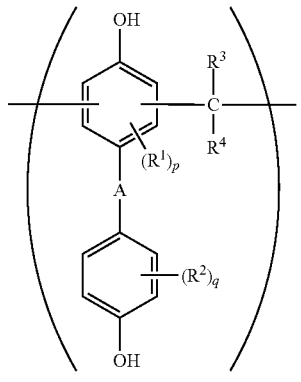

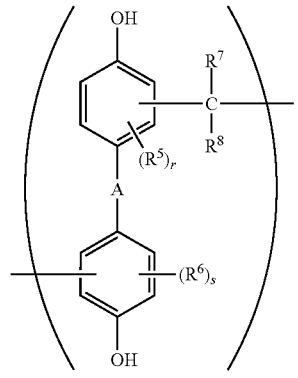

wherein in formulae (1) and (2),
A represents a divalent substituent having a halogen atom;
$R^1$, $R^2$, $R^5$, and $R^6$ independently represent a hydrogen atom or an optionally substituted $C_{1-10}$ hydrocarbon group, methylol group, or alkoxymethyl group;
$R^3$, $R^4$, $R^7$, and $R^8$ independently represent a hydrogen atom or an optionally substituted $C_{1-10}$ hydrocarbon group;
p represents an integer of 0 to 2;
q represents an integer of 0 to 4; and
r and s represent an integer of 0 to 3.

2. The photosensitive resin composition according to claim 1, wherein the halogen atom of said phenolic resin (b) having a halogen atom comprises a fluorine atom.

3. The photosensitive resin composition according to claim 1, wherein A in the general formula (1) and/or the general formula (2) is -C(CF$_3$)$_2$-.

4. The photosensitive resin composition according to claim 1, wherein said alkali-soluble resin (a) comprises a polyimide, a polybenzoxazole, a polyamide-imide, a precursor thereof, and/or a copolymer thereof.

5. The photosensitive resin composition according to claim 1, wherein the amount of said phenolic resin (b) having a halogen atom is 10 to 100 parts by mass with respect to 100 parts by mass of said alkali-soluble resin (a).

6. The photosensitive resin composition according to claim 1, wherein said phenolic resin (b) having a halogen atom has, as a repeating unit(s), 50 to 100 mol % of a structure represented by formula (1) and/or general formula (2) with respect to 100 mol % of all repeating units constituting said phenolic resin (b) having a halogen atom.

7. The photosensitive resin composition according to claim 1, wherein the amount of said photosensitive compound (c) is 25 to 100 parts by mass with respect to 100 parts by mass of the total of said alkali-soluble resin (a) and said resin (b).

8. The photosensitive resin composition according to claim 1, wherein said photosensitive compound (c) comprises a quinone diazide compound.

9. The photosensitive resin composition according to claim 1, further comprising a thermal crosslinking agent (d).

10. The photosensitive resin composition according to claim 1, further comprising a phenolic compound (e) having an electron-withdrawing group and a phenolic hydroxyl group and having a molecular weight of 100 or more and less than 500.

11. A photosensitive resin sheet formed from said photosensitive resin composition according to claim 1.

12. A cured film formed by curing said photosensitive resin composition according to claim 1.

13. An organic EL display device comprising a driving circuit, a planarization layer, a first electrode, an insulation layer, a light-emitting layer, and a second electrode on a substrate, wherein said planarization layer and/or insulation layer contain(s) said cured film according to claim 12.

14. The organic EL display device according to claim 13, wherein said substrate comprises a resin film.

15. The organic EL display device according to claim 13, wherein at least a part of said planarization layer and/or said insulation layer has a bendable portion and/or a bent and fixed portion, and wherein the curvature radius of said bendable portion and/or the bent and fixed portion is in the range of 0.1 mm or more and 5 mm or less.

16. The organic EL display device according to claim 13, wherein said planarization layer is multilayered.

17. A semiconductor electronic component or semiconductor device having an electrode, a metal wiring, an interlayer insulation layer, and/or a surface protective layer on a substrate, wherein said interlayer insulation layer and/or said surface protective layer contain(s) said cured film according to claim 12.

18. A method of producing an organic EL display device, comprising the steps of:
   forming a photosensitive resin film on a substrate using said photosensitive resin composition according to claim 1;
   exposing said photosensitive resin film;
   developing the exposed photosensitive resin film; and
   heating the developed photosensitive resin film.

* * * * *